US011695260B2

(12) United States Patent
Coenegracht et al.

(10) Patent No.: US 11,695,260 B2
(45) Date of Patent: Jul. 4, 2023

(54) TELECOMMUNICATIONS ENCLOSURE WITH A SEPARATE MOUNTABLE HINGE

(71) Applicant: COMMSCOPE TECHNOLOGIES LLC, Hickory, NC (US)

(72) Inventors: Philippe Coenegracht, Hasselt (BE); Pieter Doultremont, Kermt-Hasselt (BE); Johan Geens, Bunsbeek (BE); Robert A. Roach, Garner, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/251,713

(22) PCT Filed: Jun. 12, 2019

(86) PCT No.: PCT/US2019/036713
§ 371 (c)(1),
(2) Date: Dec. 11, 2020

(87) PCT Pub. No.: WO2019/241347
PCT Pub. Date: Dec. 19, 2019

(65) Prior Publication Data
US 2021/0119424 A1  Apr. 22, 2021

Related U.S. Application Data

(60) Provisional application No. 62/683,895, filed on Jun. 12, 2018, provisional application No. 62/748,003, filed on Oct. 19, 2018.

(51) Int. Cl.
*G02B 6/44* (2006.01)
*H02B 1/38* (2006.01)
*H05K 5/06* (2006.01)

(52) U.S. Cl.
CPC ............... *H02B 1/38* (2013.01); *G02B 6/445* (2013.01); *G02B 6/4444* (2013.01); *H05K 5/061* (2013.01)

(58) Field of Classification Search
CPC ........ G02B 6/445; F16J 13/18; H05K 5/0004; A01C 15/006
See application file for complete search history.

(56) References Cited

U.S. PATENT DOCUMENTS

| 5,828,807 A | 10/1998 | Tucker et al. |
| 7,612,300 B2 * | 11/2009 | Owens ................. G02B 6/4459 174/72 A |

(Continued)

FOREIGN PATENT DOCUMENTS

| CN | 102204049 A | 9/2011 |
| CN | 103228550 A | 7/2013 |

(Continued)

OTHER PUBLICATIONS

Google search for "Sportsman Plano 1919" (2014-2017) and resulting photos. (Year: 2017).*

(Continued)

*Primary Examiner* — Eric Wong
(74) *Attorney, Agent, or Firm* — Merchant & Gould P.C.

(57) ABSTRACT

The present disclosure relates to a telecommunications enclosures that can be customizable to include a hinge. That is, a separate hinge may be utilized as an add-on feature for telecommunications enclosures. The hinge can be attached to at least two different sides of an enclosure or may not be utilized at all. Such a configuration allows for flexibility of a variety of designs for a telecommunications enclosure. The hinge can be mountable to interfaces of first and second housing pieces of an enclosure. The hinge can have rotational features and/or translational features for pivoting first (Continued)

and second housing pieces of an enclosure between first and second positions.

27 Claims, 27 Drawing Sheets

(56) References Cited

U.S. PATENT DOCUMENTS

| | | | | |
|---|---|---|---|---|
| 8,272,527 | B2 * | 9/2012 | Horn | A01C 15/006 |
| | | | | 220/849 |
| 2005/0271344 | A1 * | 12/2005 | Grubish | G02B 6/445 |
| | | | | 385/135 |
| 2011/0013875 | A1 * | 1/2011 | Bran | G02B 6/445 |
| | | | | 385/135 |
| 2015/0117829 | A1 | 4/2015 | Allen | |
| 2015/0282349 | A1 | 10/2015 | Mann et al. | |
| 2016/0077409 | A1 * | 3/2016 | Samuels | H04N 5/23216 |
| | | | | 396/419 |
| 2017/0052338 | A1 | 2/2017 | Claessens et al. | |
| 2017/0235067 | A1 | 8/2017 | Holmberg et al. | |
| 2018/0270977 | A1 * | 9/2018 | Coenegracht | H05K 5/0004 |

FOREIGN PATENT DOCUMENTS

| | | | |
|---|---|---|---|
| EP | 0 637 767 A2 | 2/1995 | |
| WO | 2009/023830 A1 | 2/2009 | |
| WO | WO-2009023830 A1 * | 2/2009 | ............. B65D 11/18 |
| WO | 2013/131788 A2 | 9/2013 | |
| WO | 2017/046187 A2 | 3/2017 | |
| WO | 2019/160995 A1 | 8/2019 | |
| WO | 2019/209613 A1 | 10/2019 | |
| WO | WO-2019209613 A1 * | 10/2019 | ........... G02B 6/4441 |
| WO | WO-2020186172 A1 * | 9/2020 | |

OTHER PUBLICATIONS

International Search Report and Written Opinion of the International Searching Authority for International Patent Application No. PCT/US2019/036713 dated Oct. 4, 2019, 10 pages.

Chinese Office Action for Chinese Patent Application No. 201980039607.1 dated Nov. 26, 2021, 16 pages.

Extended European Search Report for European Patent Application No. 19819610.7 dated Jun. 9, 2022, 13 pages.

* cited by examiner

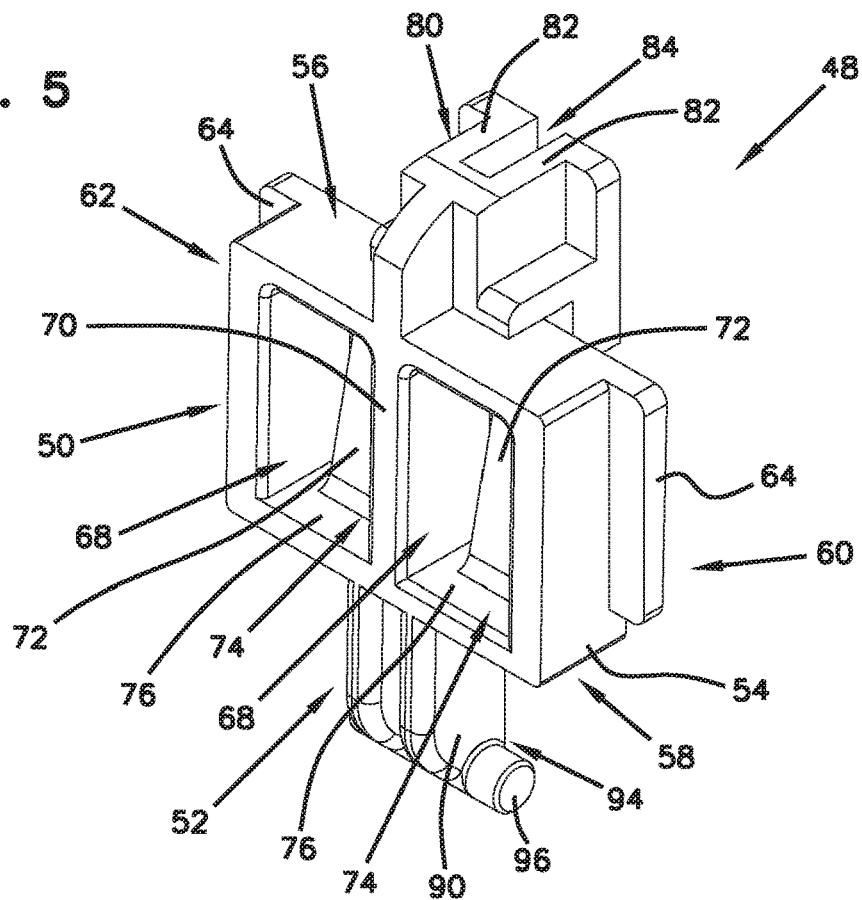
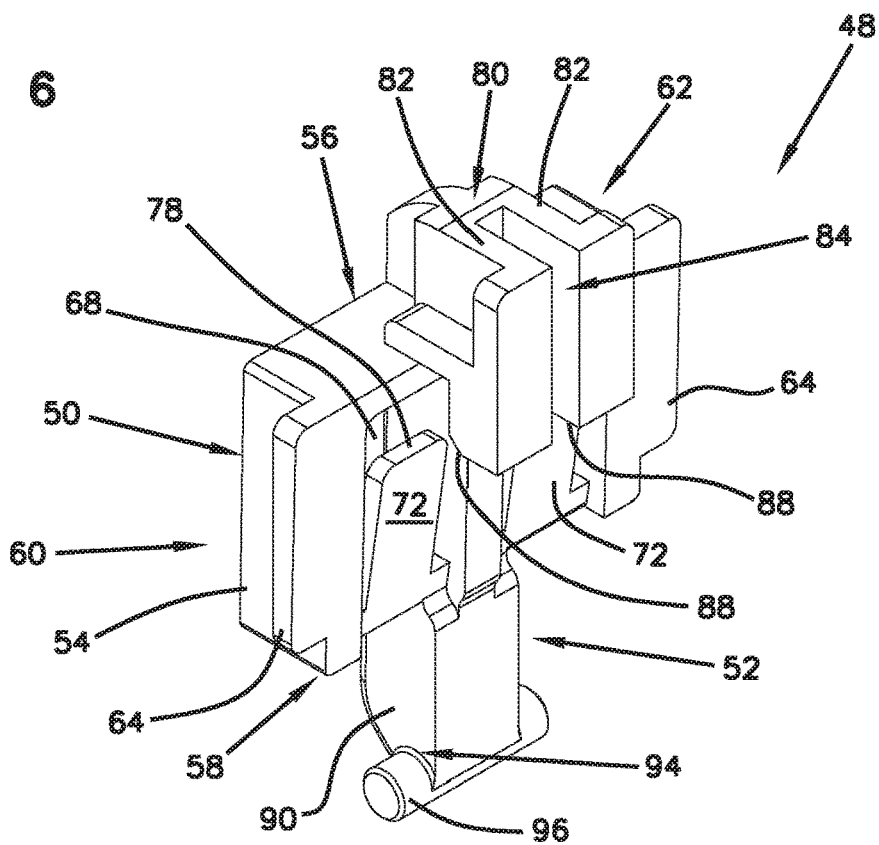

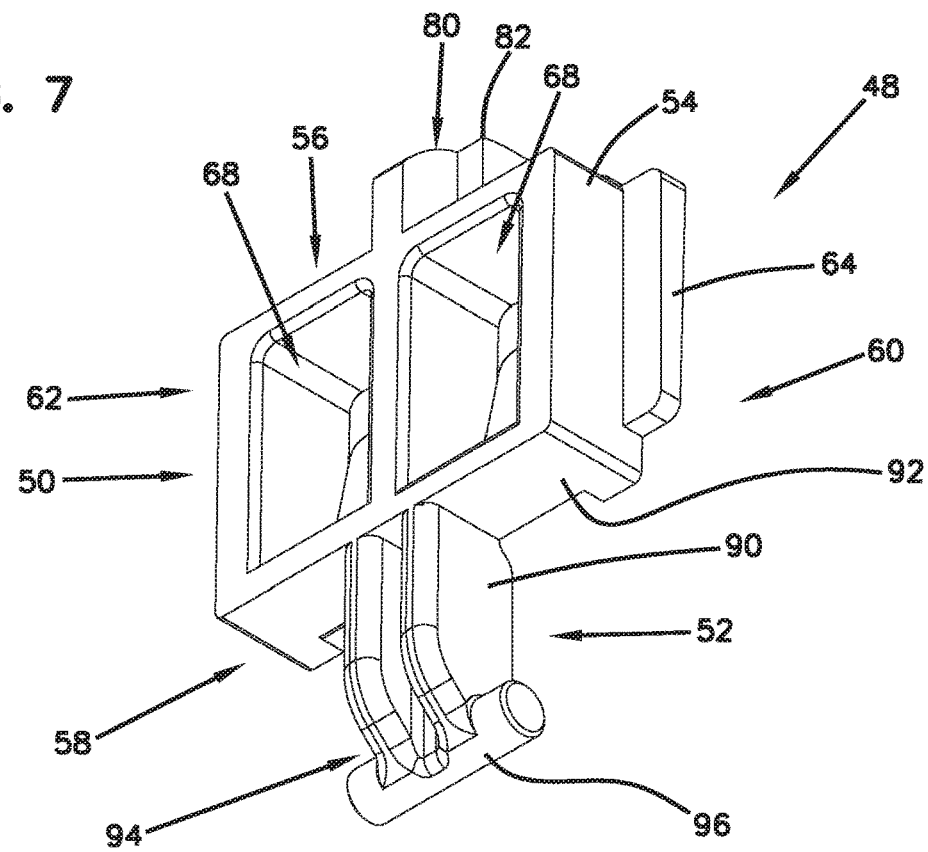
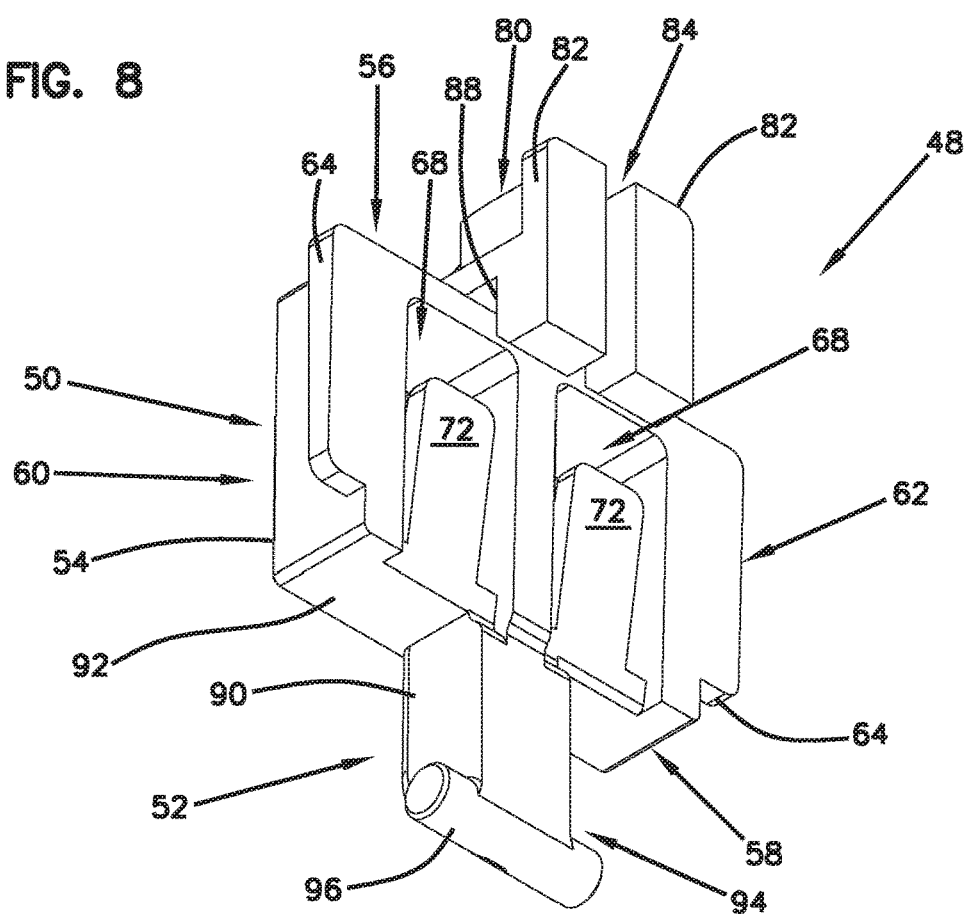

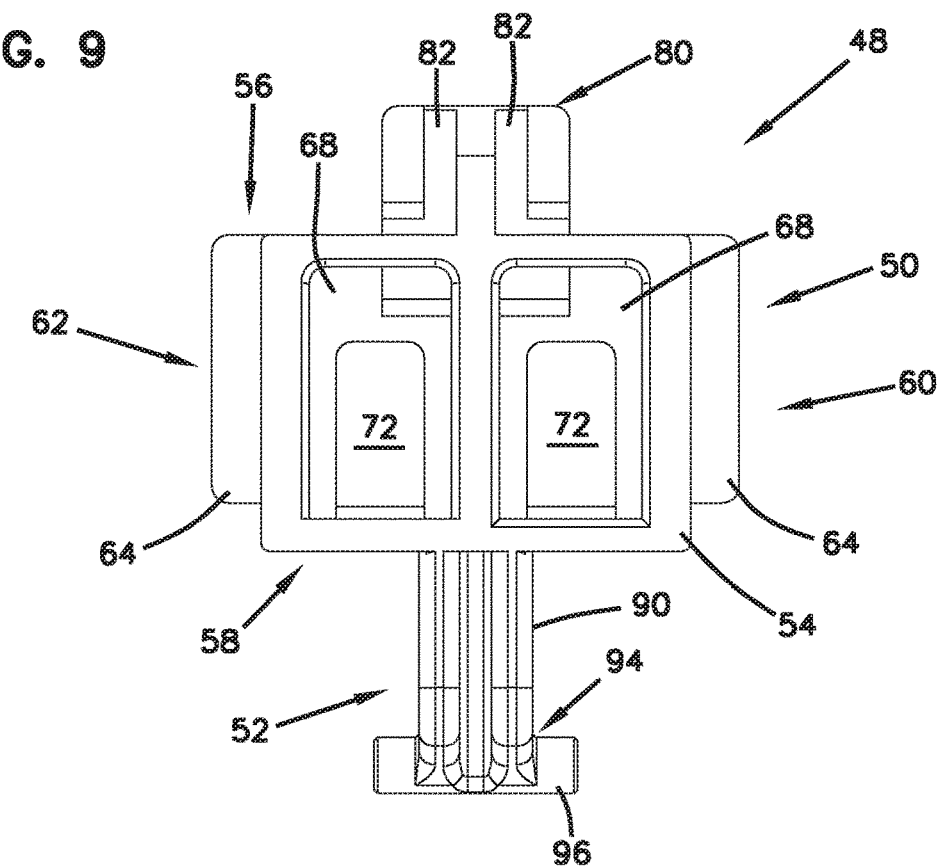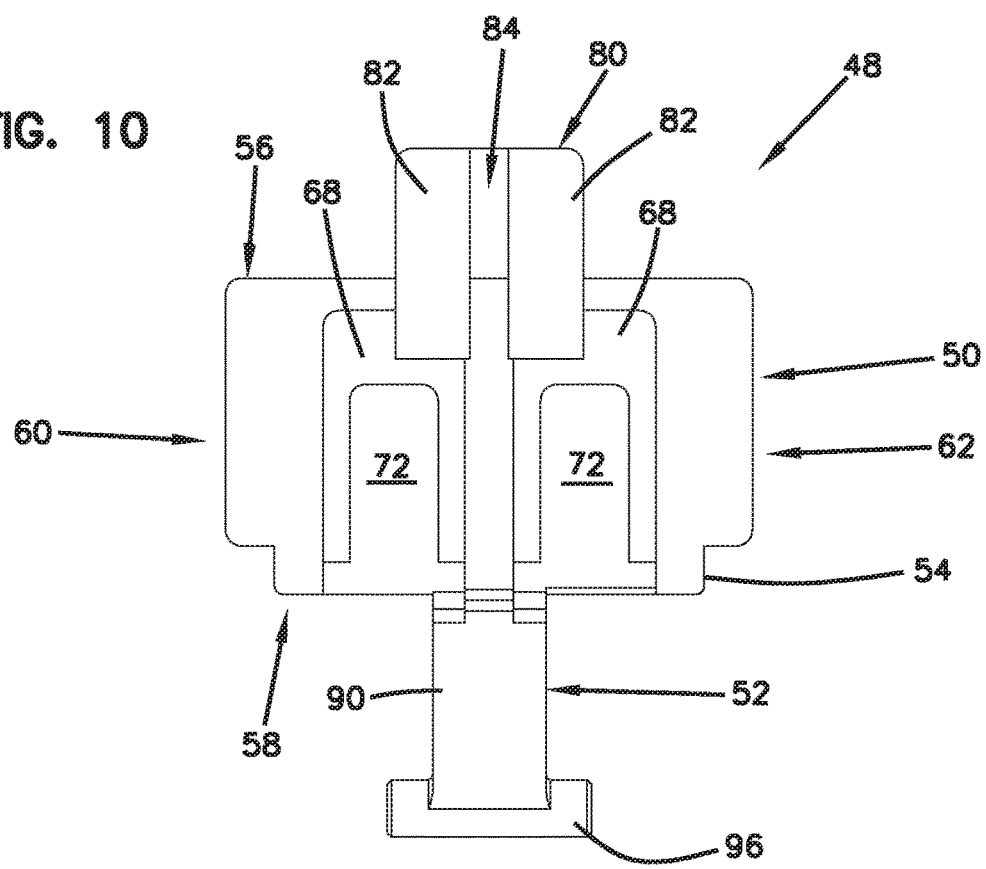

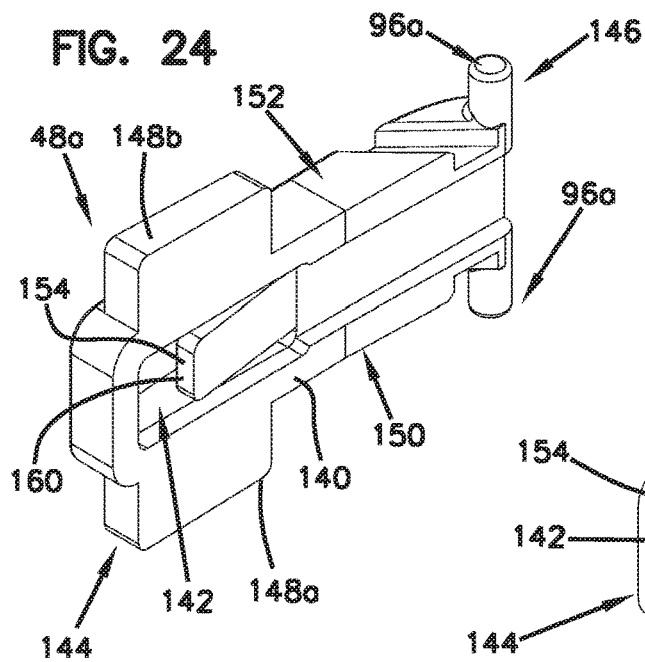
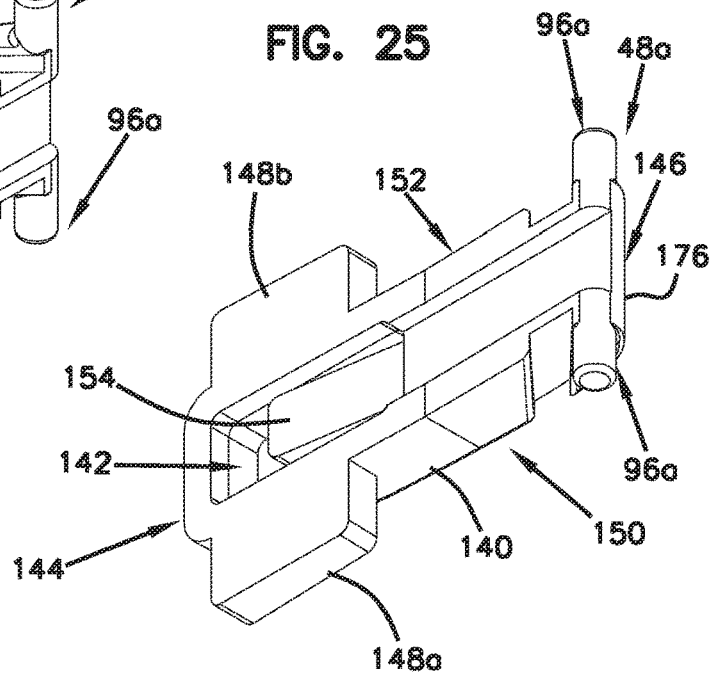
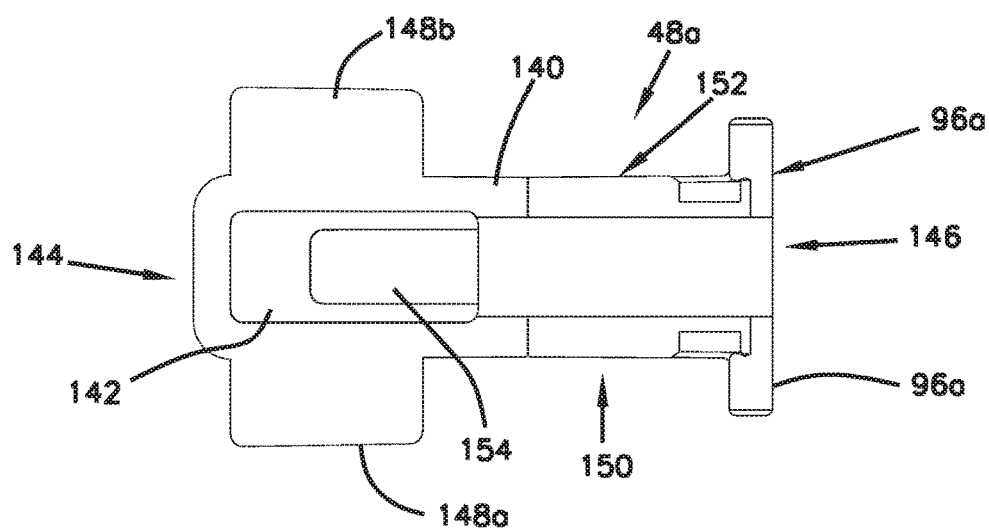
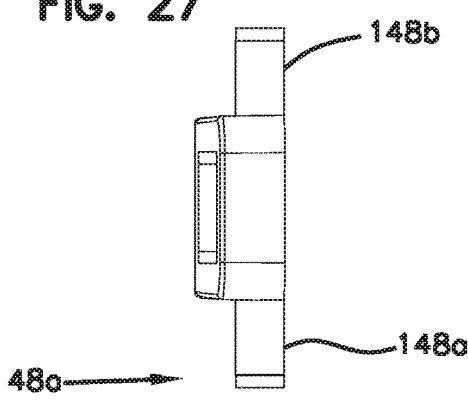
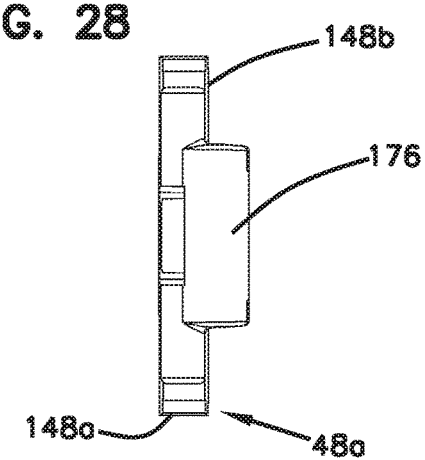

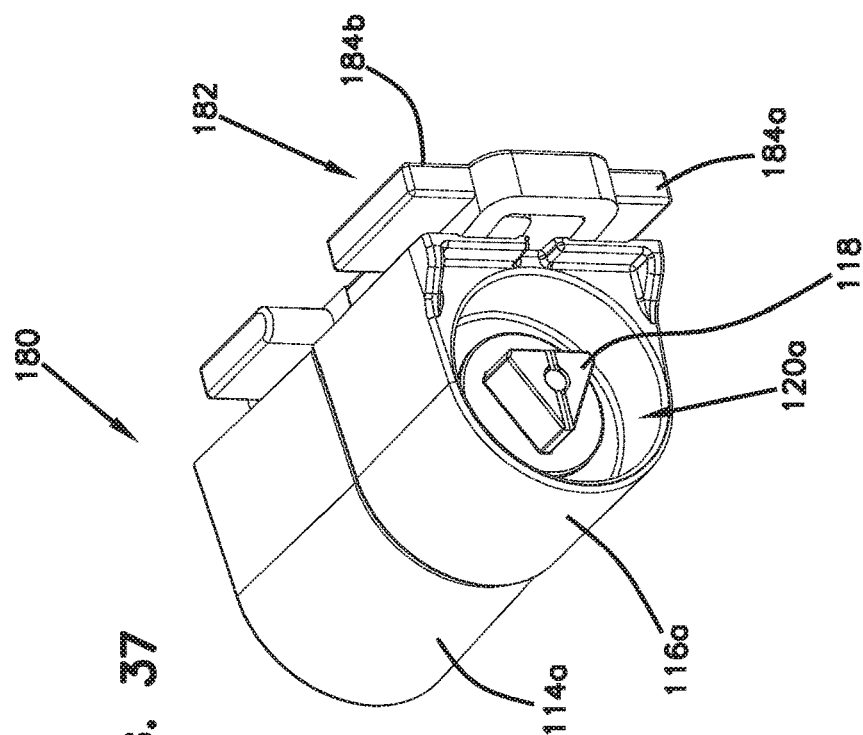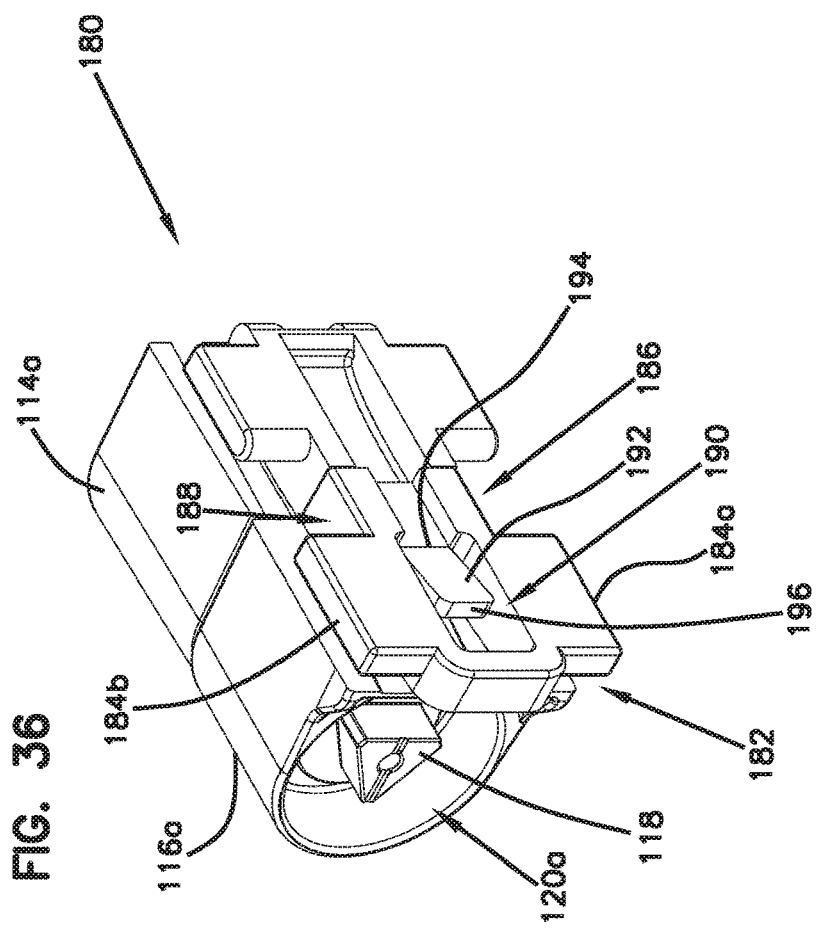

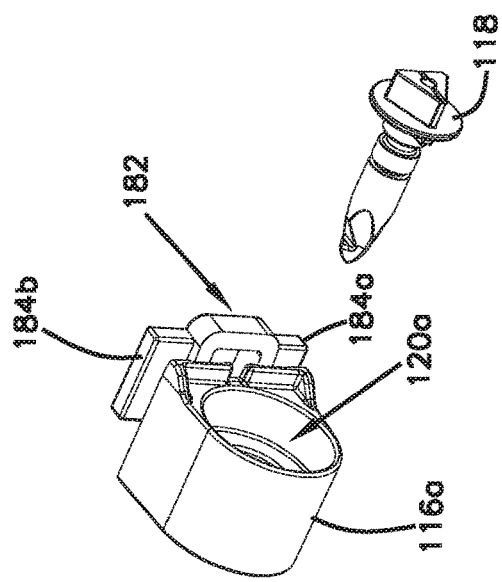
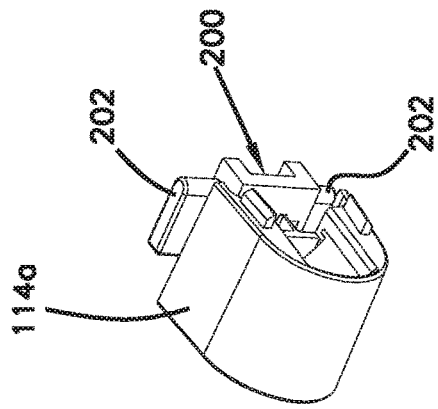
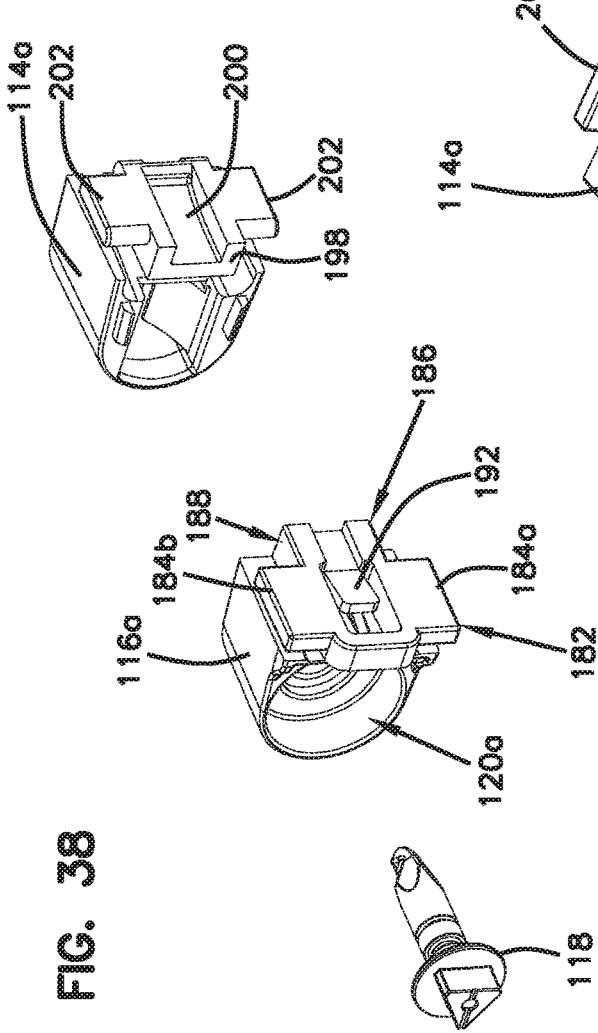
FIG. 38
FIG. 39

TELECOMMUNICATIONS ENCLOSURE WITH A SEPARATE MOUNTABLE HINGE

CROSS-REFERENCE TO RELATED APPLICATIONS

This application is a National Stage Application of PCT/US2019/036713, filed on Jun. 12, 2019, which claims the benefit of U.S. Patent Application Ser. No. 62/683,895, filed on Jun. 12, 2018, and claims the benefit of U.S. Patent Application Ser. No. 62/748,003, filed on Oct. 19, 2018, the disclosures of which are incorporated herein by reference in their entireties. To the extent appropriate, a claim of priority is made to each of the above disclosed applications.

TECHNICAL FIELD

The present disclosure relates generally to telecommunications enclosures. More specifically, the present disclosure relates to a hinge usable with telecommunications enclosures.

BACKGROUND

In many traditional communications networks, fiber optic cables have been used to carry data long distances between telecommunication company installations. In such traditional communications networks, other types of cables, such as copper wire loops and coaxial cables, have been used to carry data from telecommunication company installations to homes and businesses. Recently, there has been a movement to extend the fiber optic portion of the communications networks closer to homes and businesses. In some circumstances, the fiber optic portions of the communications networks extend into to the homes and businesses themselves.

Extending the fiber optic portion of a communications network closer to homes and businesses has necessitated the deployment of telecommunication enclosures. The telecommunication enclosure can be designed to facilitate splicing and termination of one or more fiber optic cables. A typical telecommunication enclosure has a set of cable entry ports through which fiber optic cables enter the telecommunication enclosure. One or more of the cable entry ports may accommodate "feeder" cables that connect to upstream points, such as telecommunication company installations, in a communications network. One or more of the other cable entry ports may accommodate "drop" cables that connect to downstream points in the communications network, such as homes and businesses.

Depending on the communication network architecture, the telecommunication enclosure may be a buried closure, an aerial closure or terminal, a fiber distribution hub or an optical network terminal. Enclosures generally include a cover and a base that are rotatably connected together by a conventional fixed hinge. In use, upon mating the cover and base together, a seal that's positioned in the enclosure inhibits the introduction of water, air or other contaminants into the sealed interior of the enclosure. The fixed hinges of the enclosure are typically pinned or snapped together and rotate about a fixed axis.

Generally, it is unknown which side of a telecommunications enclosure a hinge should be placed for optimal access in the field.

In view of the foregoing, there may be a need for an improved hinge for telecommunications enclosures in the interests of seal performance and flexibility of design.

SUMMARY

Aspects of the present disclosure relate to telecommunications enclosures that can be customizable to include a hinge. That is, a separate hinge may be utilized as an add-on feature for telecommunications enclosures. The hinge can be attached to at least two different sides of an enclosure or may not be utilized at all. For example, the hinge may be attached to any number of sides of an enclosure except for at a cable port side or cable entry side of an enclosure. Such a configuration allows for flexibility of a variety of designs for a telecommunications enclosure. The hinge can have interfaces for attaching to first and second housing pieces of an enclosure.

The advantageous features of having a separate hinge allows the hinge to be attached to telecommunications enclosures in the field that would optimize access to the enclosures. The separate hinge may be added to an enclosure without any complexity. The hinge can have rotational features and/or translational features for pivoting first and second housing pieces of an enclosure between first and second positions. The hinge providing a uniform compression of a seal positioned along a sealing surface of the enclosure when the first and second housing pieces are fitted together. In certain examples, the hinge can be attached to the enclosure by a snap-fit connection or a press fit connection, although alternatives are possible.

These and other features and advantages will be apparent from a reading of the following detailed description and a review of the associated drawings. A variety of additional aspects will be set forth in the description that follows. These aspects can relate to individual features and to combinations of features. It is to be understood that both the foregoing general description and the following detailed description are exemplary and explanatory only and are not restrictive of the broad concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows:

FIG. 5 is a top front perspective view of the hinge of FIG. 4;

FIG. 6 is a top back perspective view of the hinge of FIG. 5;

FIG. 7 is a bottom front perspective view of the hinge of FIG. 5;

FIG. 8 is a bottom back perspective view of the hinge of FIG. 6;

FIG. 9 is a front plan view of the hinge of FIG. 5;

FIG. 10 is a back plan view of the hinge of FIG. 6;

FIGS. 24-28 are multiple perspective views of the hinge of FIGS. 19-23;

FIGS. 36-37 are perspective views of the modular locking device of FIG. 35; and

FIGS. 38-39 are exploded views of the modular locking device of FIGS. 36-37.

DETAILED DESCRIPTION

Figure 1:
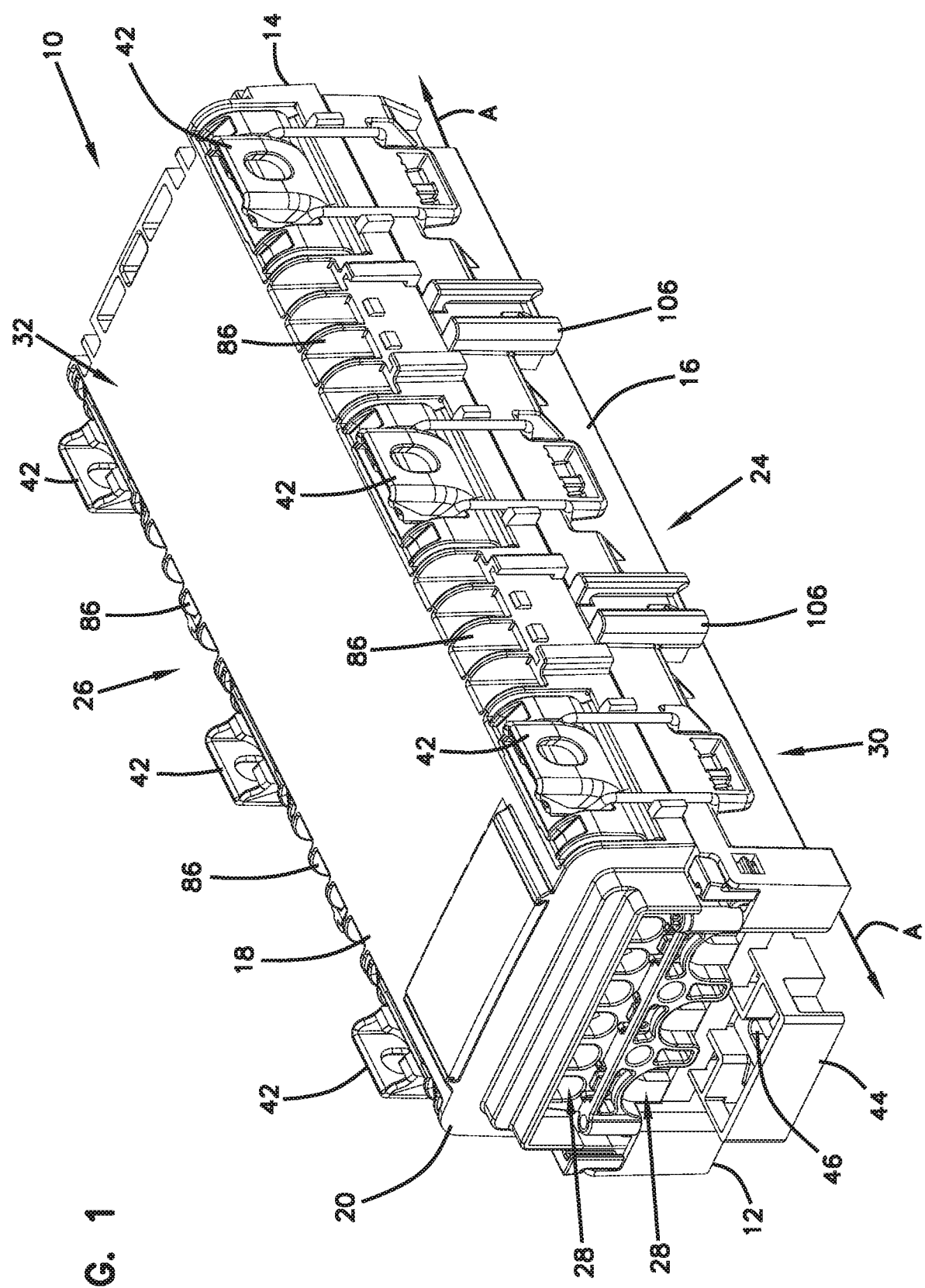
FIG. 1 is a left side perspective view of an example telecommunications enclosure configured in accordance with the present disclosure, the telecommunications enclosure having a first housing piece and a second housing piece shown in a closed position.
Figure 2:
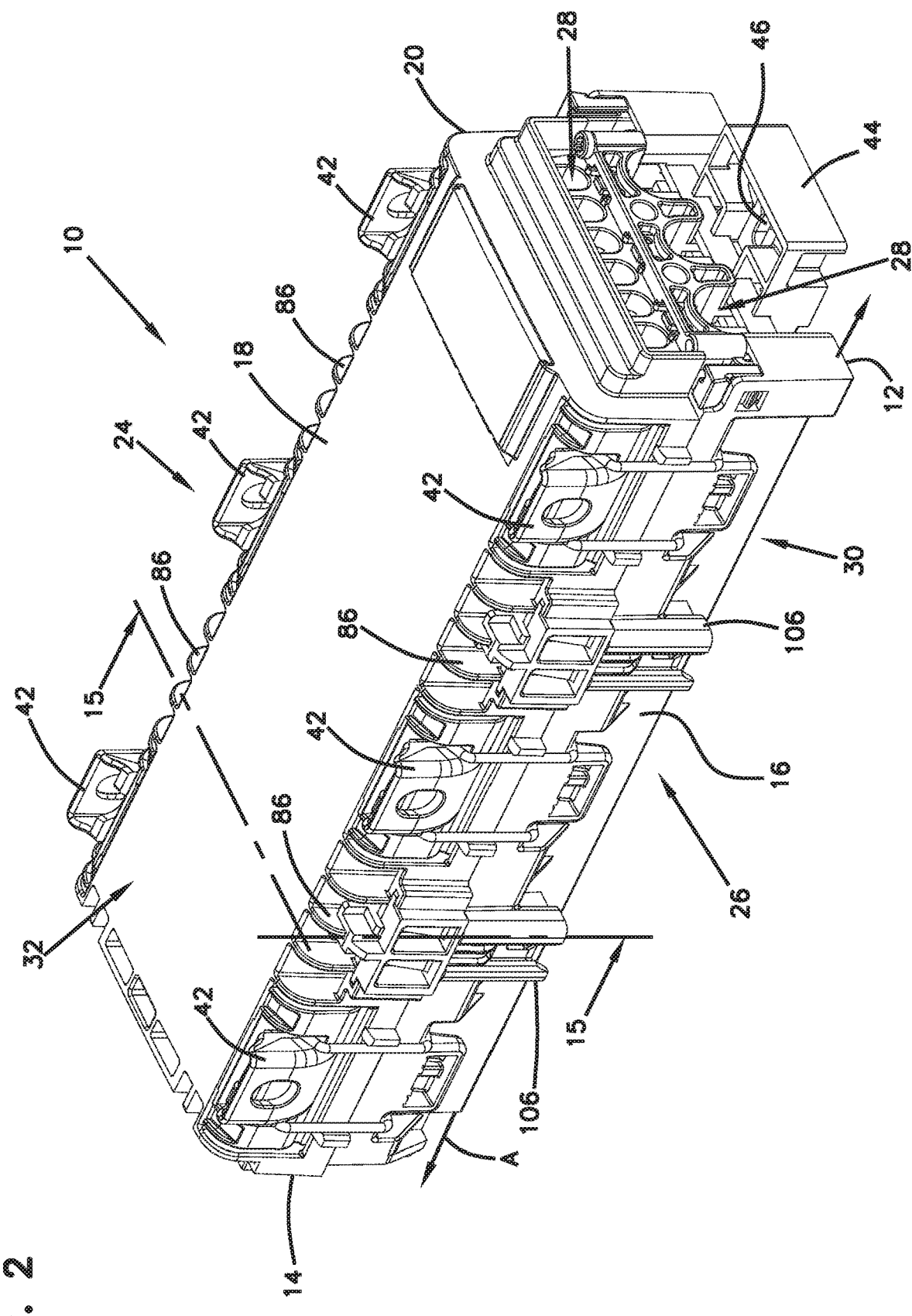
FIG. 2 is a right side perspective view of the telecommunications enclosure of FIG. 1 and hinges mounted on a side of the telecommunications enclosure in accordance with the principles of the present disclosure.
Figure 3:
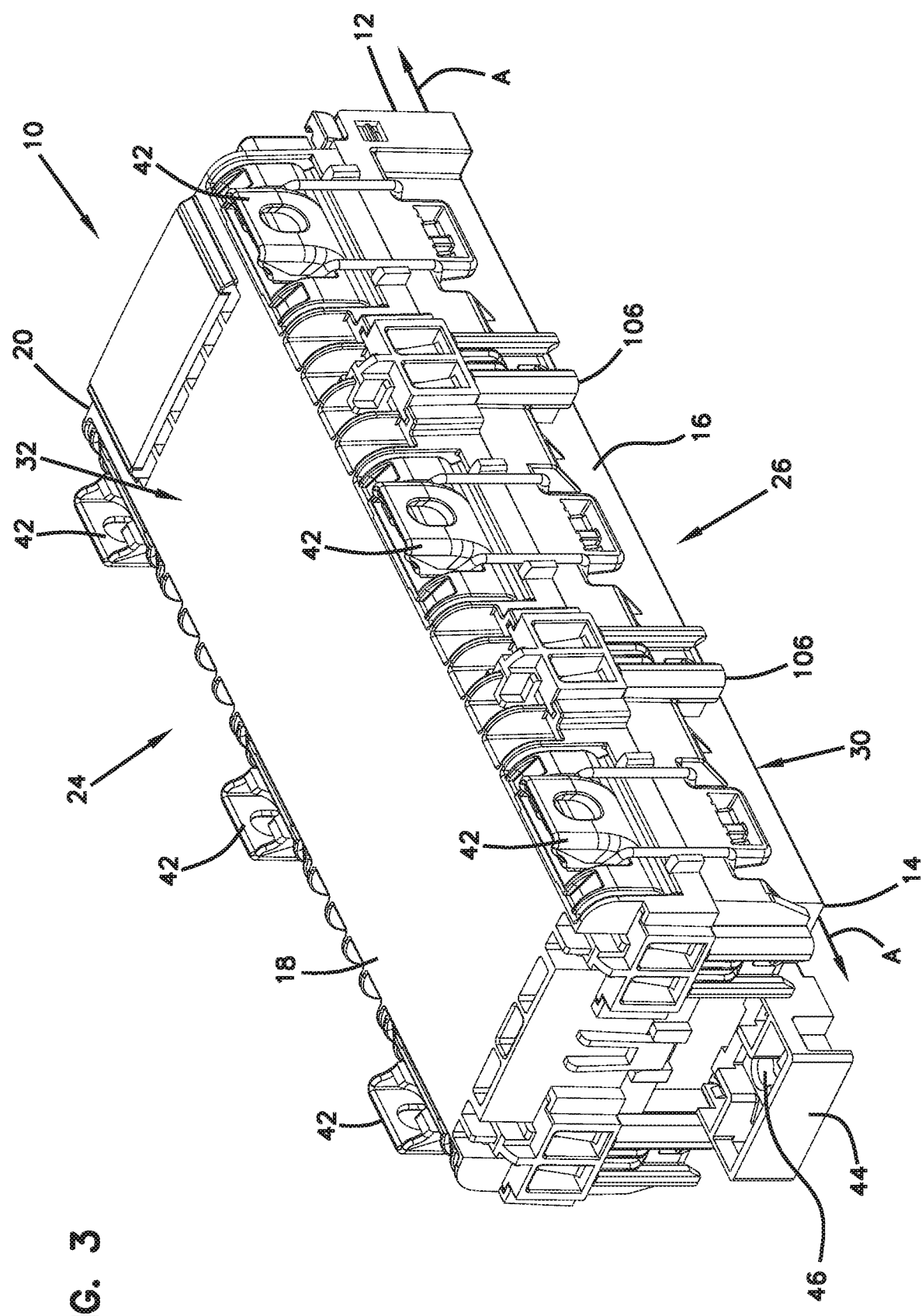
FIG. 3 is a side perspective view of the telecommunications enclosure of FIG. 1 showing a top end of the enclosure, the hinges are shown mounted at two sides of the enclosure.

The present invention is described with reference to the accompanying drawings, in which certain embodiments of the invention are shown. This invention may, however, be embodied in many different forms and should not be construed as limited to the embodiments that are pictured and described herein; rather, these embodiments are provided so that this disclosure will be thorough and complete, and will fully convey the scope of the invention to those skilled in the art. It will also be appreciated that the embodiments disclosed herein can be combined in any way and/or combination to provide many additional embodiments.

Various boxes for telecommunications equipment are known. The boxes used for subscriber access points can have various forms depending on such factors as the environment, the space requirements for containing telecommunications equipment, and the type of technician access needed for the telecommunications equipment. These and other considerations are related to box design and usability.

Aspects of the present disclosure relate to telecommunications enclosures that may be customized with a hinge to optimize access in the field. That is, a hinge can be a separate piece that is adapted to be mounted on any side of an enclosure except for a cable entry side to provide flexibility in design. A hinge may be mounted on a left side, a right side, or a top side of an enclosure to provide preferred access to components contained therein. The advantageous feature of a separate hinge is the flexibility it provides a technician to mount the hinge as desired once in the field to optimize access. It will be appreciated that other types of enclosures may be utilized in accordance with principles of the present disclosure.

Another aspect of the present disclosure relates to a hinge that can be adapted to pivot a first housing piece of an enclosure relative to a second housing piece of an enclosure such that rotation and/or translation of the hinge achieves uniform compression of a seal positioned along an enclosure circumference. The seal may be compromised if compression of the seal is too high in one region and/or too low in another region. The hinge of the present disclosure ensures that a portion of the seal that is closest to the hinge is not more compressed than a portion of the seal that is furthest from the hinge.

FIGS. 1-4 illustrate an example telecommunications enclosure 10 in accordance with the principles of the present disclosure. The telecommunications enclosure 10 includes a housing 20. The housing 20 is elongate along a major axis A of the housing 20. The major axis A extends along a length of the housing 20 between first and second opposite ends 12, 14. The housing 20 is preferably re-enterable and environmentally sealed.

The housing 20 includes a first housing piece (e.g., a base) 16 and a second housing piece (e.g., a cover) 18 that cooperate together to define an interior 22 (see FIG. 14) of the housing 20. The first housing piece 16 can be moveable relative to the second housing piece 18 between a first position (e.g., an open position) and a second position (e.g., a closed position). In certain examples, the first housing piece 16 is pivotally movable relative to the second housing piece 18 between the first and second positions. The housing 20 of the enclosure 10 includes a first side 24 and an opposite, second side 26 that extend between the first and second ends 12, 14. The first and second housing pieces 16, 18 cooperate to form the first and second sides 24, 26 of the enclosure 10. At least one sealed cable pass-through port 28 can be defined at the first end 12 (e.g., fourth side) of the housing 20. The second end 14 (e.g., third side) of the housing 20 is generally solid (i.e., does not define cable ports). For other examples, such as straight-pass through examples, the second end may have cable ports.

In certain examples, the first housing piece 16 forms a bottom 30 of the enclosure 10 and the second housing piece 18 forms a top 32 of the enclosure 10. It will be appreciated that the first housing piece 16 may form the top 32 of the enclosure 10 and the second housing piece 18 may form the bottom 30 of the enclosure. The first housing piece 16 and the second housing piece 18 may be injection-molded plastic components. Alternatively, the first housing piece 16 and the second housing piece 18 may be composed of aluminum and formed by a casting process, for example. It should be understood that the first and second housing pieces 16, 18 may be composed of any material and made by any forming process known to those skilled in the art without departing from the scope of the present disclosure.

The first and second housing pieces 16, 18 can meet at a sealing interface 34 (see FIG. 15) that forms a perimeter seal between the first and second housing pieces 16, 18 when the first and second housing pieces 16, 18 are fitted (e.g., mated) together. The sealing interface 34 includes an elastomeric sealing member 36 (e.g., gasket or sealing ring) that can be arranged in a continuous loop. The elastomeric sealing member 36 fits within a sealing channel 38 of the first housing piece 16. In certain examples, the elastomeric sealing member 36 can be disposed between the first and second housing pieces 16, 18 around the perimeter of the enclosure 10.

Figure 15:
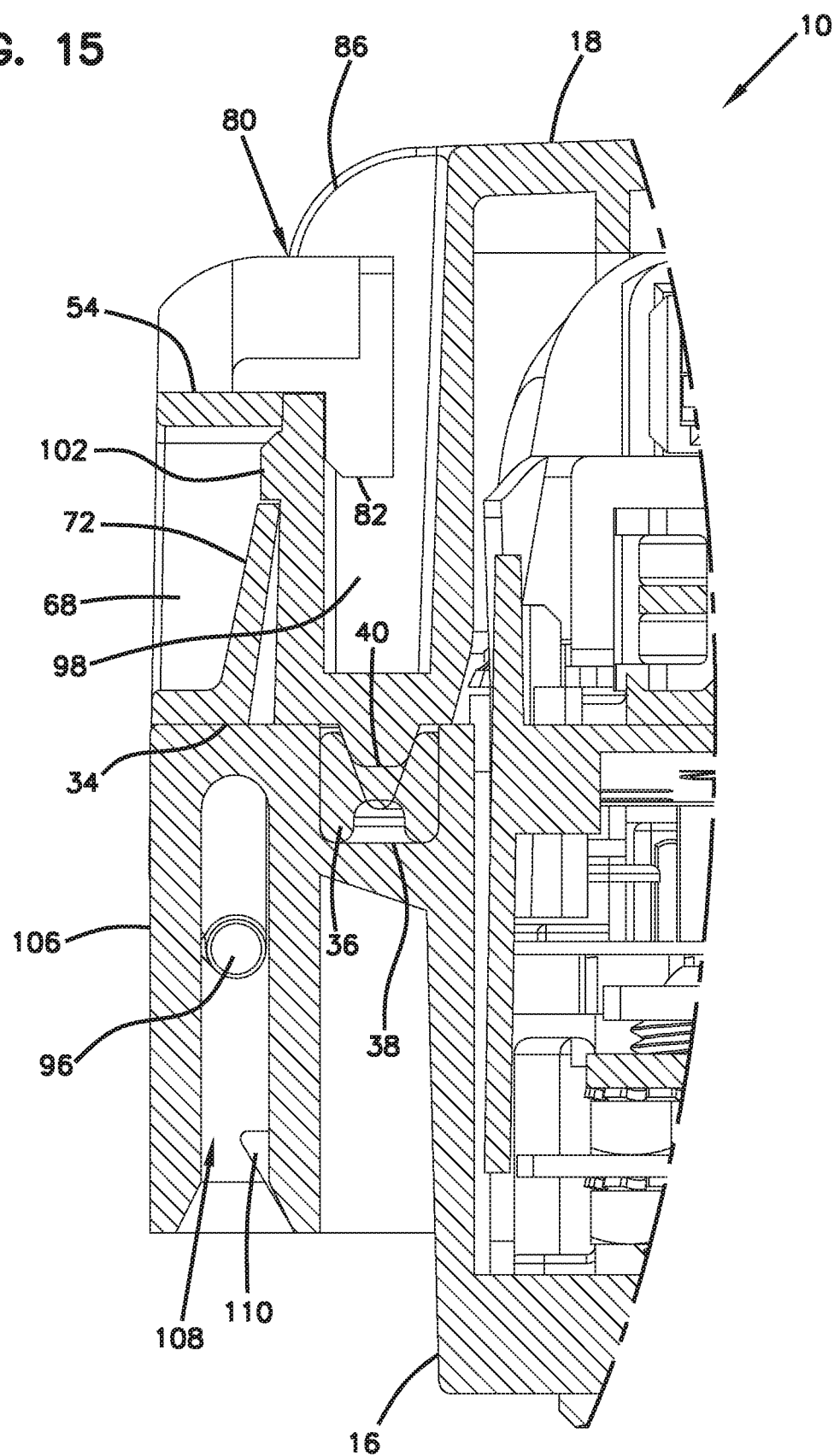
FIG. 15 is an enlarged cross-section view of a portion of FIG. 14 showing the hinge mounted to the telecommunications enclosure in accordance with the principles of the present disclosure.

In certain examples, the second housing piece 18 can include a sealing rib 40 (e.g., tongue) (see FIG. 15). In use, the sealing rib 40 can project into the sealing channel 38 and engage (e.g., compress) the elastomeric sealing member 36 in the sealing channel 38 when the first and second housing pieces 16, 18 are fitted together. In other examples, the second housing piece 18 may define a second channel instead of the sealing rib 40 to accommodate the elastomeric sealing member 36. In still other examples, the second housing piece 18 may define the channel and the first housing piece 16 may define the sealing rib. The elastomeric sealing member 36 inhibits dirt, water, or other contaminants from entering the enclosure 10 when the second housing piece 18 is secured to the first housing piece 16.

In certain examples, the second housing piece 18 can be secured to the first housing piece 16 using latching arrangements 42. The latching arrangements 42 can be spaced about a perimeter of the housing 20 to clamp the second housing piece 18 in the first position relative to the first housing piece 16. For example, in certain implementations, each latching arrangement 42 is configured to releasably latch the second housing piece 18 to the first housing piece 16. The latching arrangements 42 can be arranged and configured on both the first and second sides 24, 26 of the enclosure 10.

In certain examples, at least one of the latching arrangements 42 can be disposed on at least one of a plurality of sidewalls of the enclosure 10 for securing the first and second housing pieces 16, 18 together in the first position. In certain examples, a plurality of spaced latching arrangements 42 can be disposed on at least one of the plurality of sidewalls of the enclosure 10. It should be understood that once the latching arrangements 42 are released, the second housing piece 18 can be detached from the first housing piece 16. That is, by opening the latching arrangements 42, the housing 20 can be moved to the second position of FIG. 14.

In certain examples, the housing 20 includes a mounting structure 44 to hold the housing 20 to a pole, wall, or other surface. In certain examples, the mounting structure 44 defines a fastener opening 46 therethrough. In certain examples, the mounting structures 44 can be positioned at the first and second ends 12, 14 of the housing 20.

The housing 20 may also include a cable sealing arrangement (not shown) for forming seals about cables (e.g., feeder cables and/or drop cables) routed into the interior 22 of the enclosure 10 such that the cable entry end of the enclosure 10 is sealed. The sealing arrangement can include a cable sealing arrangement at the first end 12 of the housing 20. The cable sealing arrangement can include a rear gel volume mounted in the first housing piece 16, a front gel volume mounted in the second housing piece 18. In certain examples, an intermediate gel volume can be positioned between the front and rear gel volumes.

A management unit 300 (see FIG. 30) may be mounted within the interior 22 of the housing 20. The enclosure 10 can be adapted to receive telecommunications hardware for splicing. The management unit may include a tray, splice mounting components, a bank of adapters mounted at an adapter mounting location that may be covered by the tray when the tray is in the closed position and may be accessible from the rear of the management unit when the tray is in the open position. Drop cables with connectorized ends can plug into the fiber optic adapters. An example enclosure having a management unit and an example sealing arrangement is disclosed by U.S. Provisional Patent Application No. 62/630,155, which is hereby incorporated by reference in its entirety.

Figure 4:
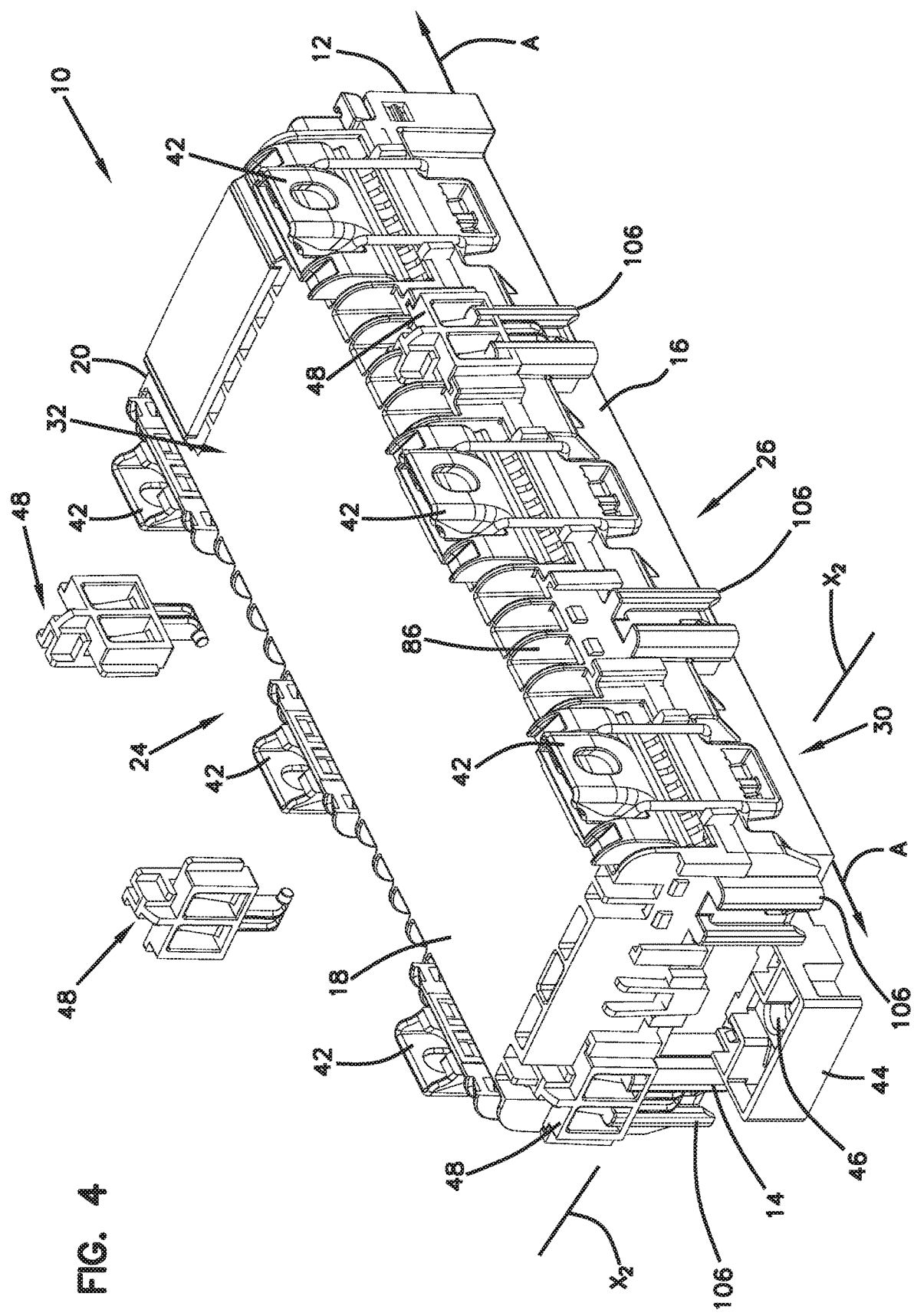
FIG. 4 is a side perspective view of the telecommunications enclosure of FIG. 3 showing the hinges exploded therefrom.

Referring still to FIG. 4, the second housing piece 18 can be hingedly coupled to the first housing piece 16 of the telecommunications enclosure 10 to pivot about an axis of rotation $A_1$ (see FIG. 16) between the second position (see FIG. 14) and the first position. In certain examples, the second housing piece 18 can be non-pivotally connected to the first housing piece 16 such that the second housing piece 18 is removable from the first housing piece 16 without pivoting therefrom. That is, the first and second housing pieces 16, 18 may be connected by the latching arrangements 42 such that by unlatching the latching arrangements 42, the first housing piece 16 can be removed from the second housing piece 18 without pivoting.

In certain examples, the second housing piece 18 can be pivotally connected to the first housing piece 16 by a hinge 48. In certain examples, at least two hinges 48 may be used to pivotably couple the second housing piece 18 to the first housing piece 16 along the axis of rotation $A_1$. It should be understood that the enclosure 10 may include any number of hinges.

In certain examples, the hinge 48 may be commonly referred to as a floating, sliding, centering or self-centering hinge, although alternatives are possible. In certain examples, the sliding/floating feature of the hinge 48 may be optional. That is, non-floating hinges may also be used. The hinge 48 can be configured to accommodate relative translation and/or rotation of one of the first housing piece 16 or the second housing piece 18. The hinge 48 can be configured to also accommodate translation of the second housing piece 18 with respect to the first housing piece 16 upon pivoting the second housing piece 18 to the first position to achieve uniform compression of the elastomeric sealing member 36 along its circumference. The hinges 48 may be configured to rotate or have a combination of rotation and translation features. In certain examples, the hinge 48 can be manufactured of a polymeric material, although alternatives are possible.

The hinges 48 may be removably attached to the enclosure 10 at any number of sides of the housing 20 except for the first end 12 where the cable ports 28 are defined. In certain examples, the hinges 48 may be mounted to the housing 20 on at least two different sides thereof. In certain examples, the hinges 48 may be mounted at the first side 24, at the second side 26, or at the second end 14 of the housing 20. When the hinges 48 are mounted at either the first side 24 or the second side 26 of the enclosure 10, a hinge axis $X_1$ (see FIG. 16) of the housing 20 may be parallel to the major axis A of the housing 20. When the hinges 48 are mounted at the second end 14 of the enclosure 10, a hinge axis $X_2$ (see FIG. 4) of the housing 20 may be perpendicular to the major axis A of the housing 20.

The hinges 48 can be separate pieces that may or may not be added to customize telecommunications enclosures. The hinges 48 may be utilized to provide a variety of flexible designs for telecommunications enclosures. The hinges 48 may be mounted on the telecommunications enclosure 10 in the field as desired to optimize access into the interior 22 thereof. In certain examples, the hinges 48 may be mounted to the housing 20 between the spaced latching arrangements 42.

Turning to FIGS. 5-10, multiple perspective views of the hinge 48 is depicted. The hinge 48 may include a first member 50 that can be adapted to mount to the second housing piece 18 of the enclosure 10 and a second member 52 that can be adapted to mount to the first housing piece 16 of the enclosure 10. It will be appreciated that the first member 50 may be adapted to mount to the first housing piece 16 and the second member 52 may be adapted to mount to the second housing piece 18.

The first member 50 of the hinge 48 may include an anchoring plate 54. The anchoring plate 54 has a top 56, a bottom 58, a first side 60 and a second side 62. The first and second sides 60, 62 are depicted on opposing sides of the anchoring plate 54. In certain examples, clamping flanges 64 may extend outwardly from respective first and second sides 60, 62 of the anchoring plate 54.

In certain examples, the anchoring plate 54 defines two openings 68 separated by a dividing wall 70 (e.g., dividing member). The two openings 68 each have a flexible member 72 therein. The flexible members 72 each have a proximal end 74 pivotally attached to an inner surface 76 at the bottom 58 of the anchoring plate 54. The flexible members 72 extend within the openings 68 from the proximal end 74 to a distal free end 78.

In certain examples, the first member 50 of the hinge 48 may further include an engagement member 80. The engagement member 80 can have two extension members 82 that define a slot (e.g., opening) 84. In use, the engagement member 80 of the hinge 48 may be adapted to mount on the second housing piece 18 of the enclosure 10, although alternatives are possible. For example, the engagement member 80 of the hinge 48 may be adapted to mount to the first housing piece 16. The extension members 82 can each extend in a transverse direction relative to the anchoring plate 54. Each one of the extension members 82 can have a hook member 88 that extends parallel to the anchoring plate 54, although alternatives are possible.

The second member 52 of the hinge 48 may include a pivoting arm 90 that extends downwardly from an exterior surface 92 at the bottom 58 of the anchoring plate 54. The pivoting arm 90 can extend in a direction parallel to the anchoring plate 54, although alternatives are possible. The pivoting arm 90 can have a distal end 94 that includes a pivot pin 96 (e.g., hinge pin) configured to rotate and/or translate the first and second housing pieces 16, 18 with respect to the other one of the first and second housing pieces 16, 18. That is, the pivot pins 96 can slide relative to the first housing piece 16 in a direction perpendicular to the pivot axis of rotation $A_1$ to allow the second housing piece 18 to seat evenly on the first housing piece 16 prior to latching. The pivot pins 96 may also float in a direction perpendicular to the pivot axis of rotation $A_1$.

Figure 11:
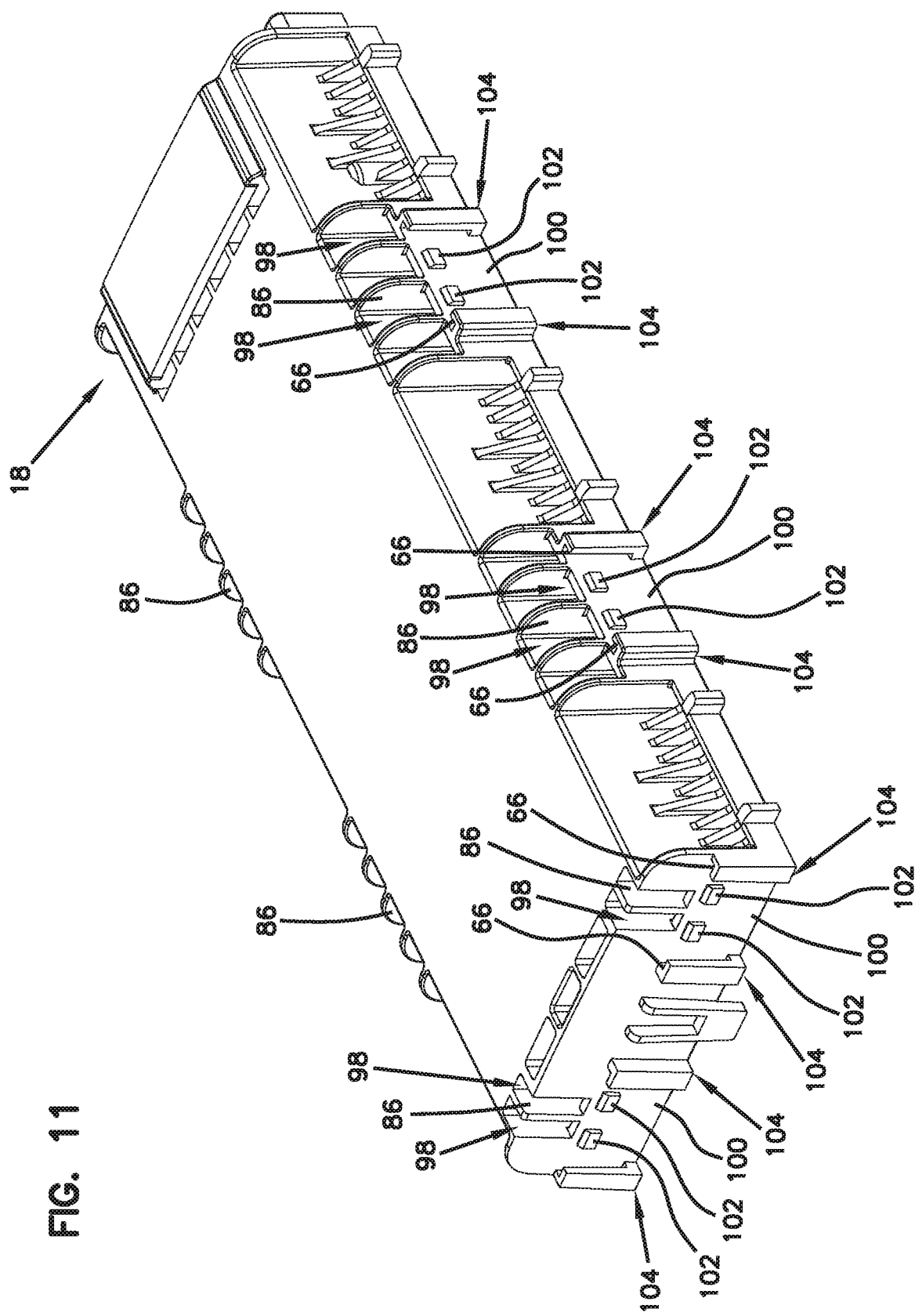
FIG. 11 is a left side perspective view of the cover of the telecommunications enclosure of FIG. 3.
Figure 12:
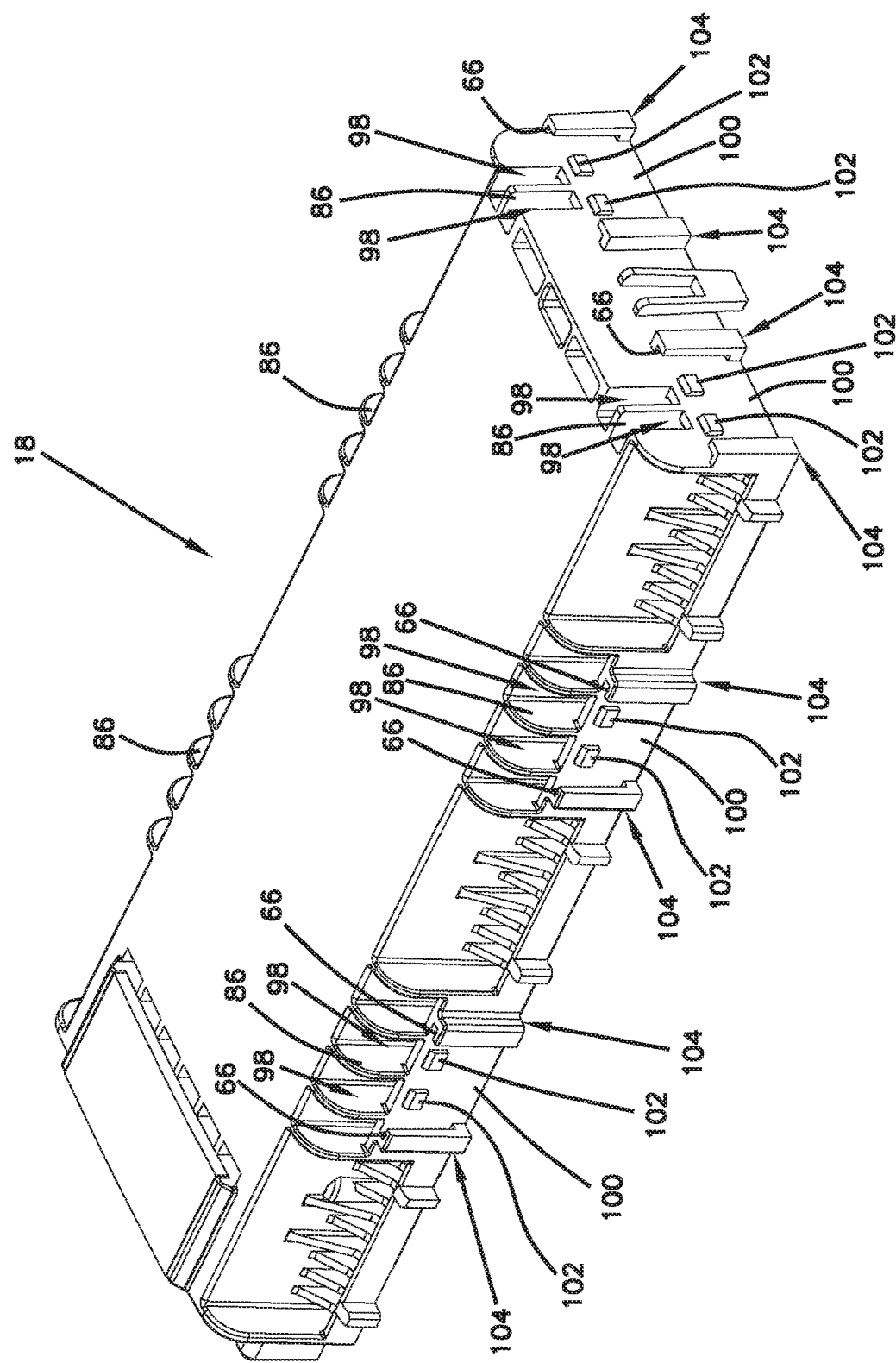
FIG. 12 is a right side perspective view of the cover of FIG. 11.
Figure 13:
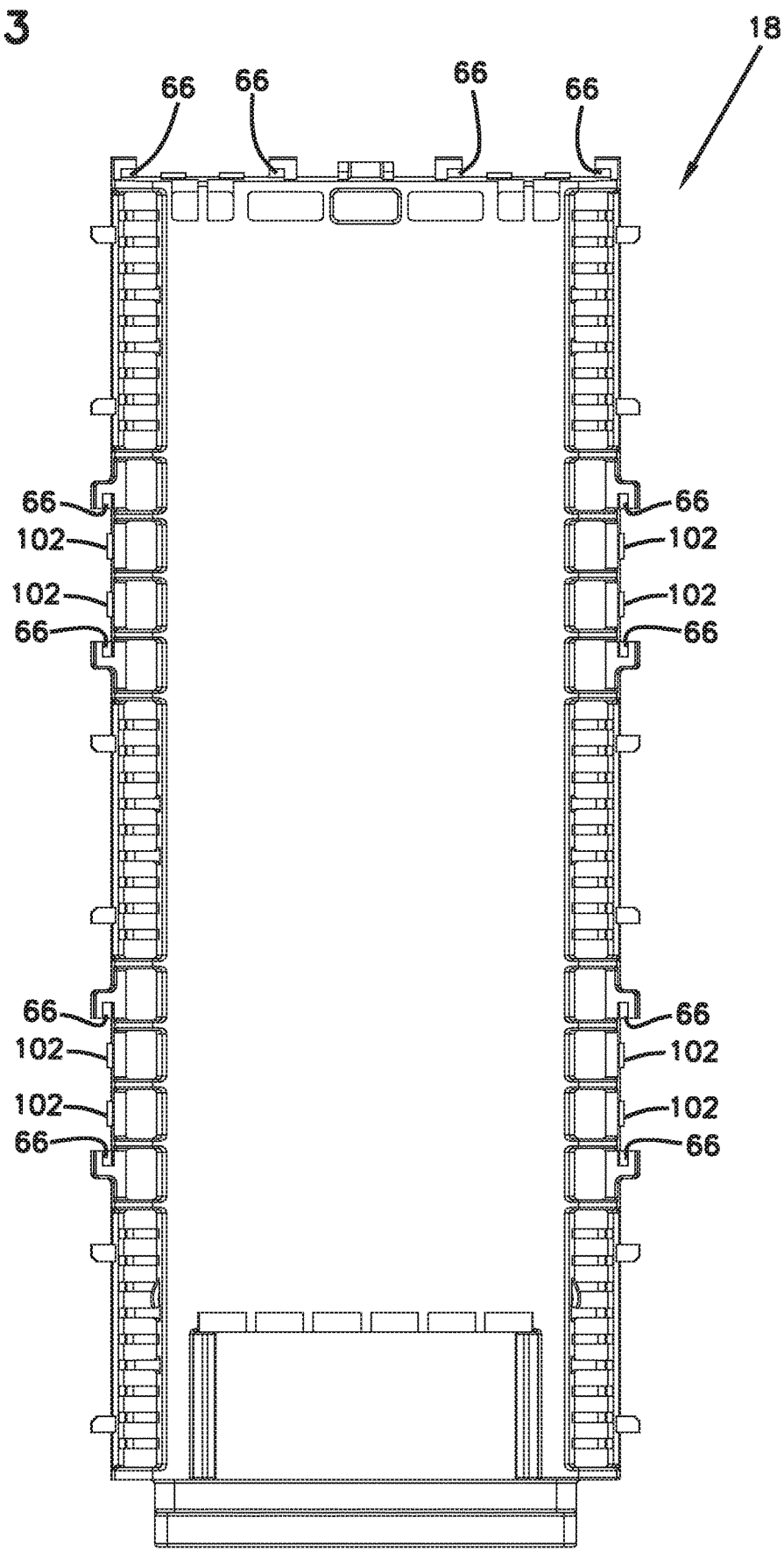
FIG. 13 is a front plan view of the cover of FIG. 11.

Turning to FIGS. 11-13, multiple views of the second housing piece 18 are depicted. One of the first and second housing pieces 16, 18 may be arranged and configured with a hinge mounting interface 100 (e.g., hinge mounting location). The hinge mounting interface 100 may include external structure 86 (e.g., rib structures, flanges, walls, etc.). The external structure 86 can be formed at any number of sides on the first and second housing pieces 16, 18 except for at the first end 12 that includes the cable ports 28. That is, the external structure 86 may be formed at the first side 24, the second side 26 and the second end 14 of the enclosure 10. The first and second housing pieces 16, 18 may have multiple hinge mounting interfaces 100 on different sides thereof. In certain examples, the first and second housing pieces 16, 18 may have the external structure 86 formed on at least two different sides. Thus, the hinge 48 may be selectively mounted at the first side 24, the second side 26, or the first end 14 of the enclosure 10.

In use, the engagement member 80 of the hinge 48 can be adapted to receive the external structure 86 within the slot 84 thereof and the hook members 88 of the extension members 82 can be arranged and configured to engage respective receptacles 98 defined by the external structures 86 located in the other one of the first and second housing pieces 16, 18.

The hinge mounting interface 100 may also include protrusions (e.g., bumps, studs, tabs) 102 that extend from a surface of the hinge mounting interface 100. The hinge mounting interface 100 may further include a clamp bracket 104 that defines slots 66. When the hinge 48 is mounted to the hinge mounting interface 100 of one of the first and second housing pieces 16, 18, the clamping flanges 64 can be configured to slidably engage the slots 66 and the distal free ends 78 of the flexible members 72 can be configured to snap past the protrusions 102 to provide a snap fit connection with either one of the first and second housing pieces 16, 18. The protrusions 102 can help prevent the hinge 48 from sliding back out of the hinge mounting interface 100. The protrusions 102 may also provide a connection between the hinge 48 and either one of the first and second housing pieces 16, 18. In certain examples, the hinge 48 may be mounted to the housing 20 by friction fit, press-fit, snap-fit connection, and/or adhesive, although alternatives are possible.

Figure 14:
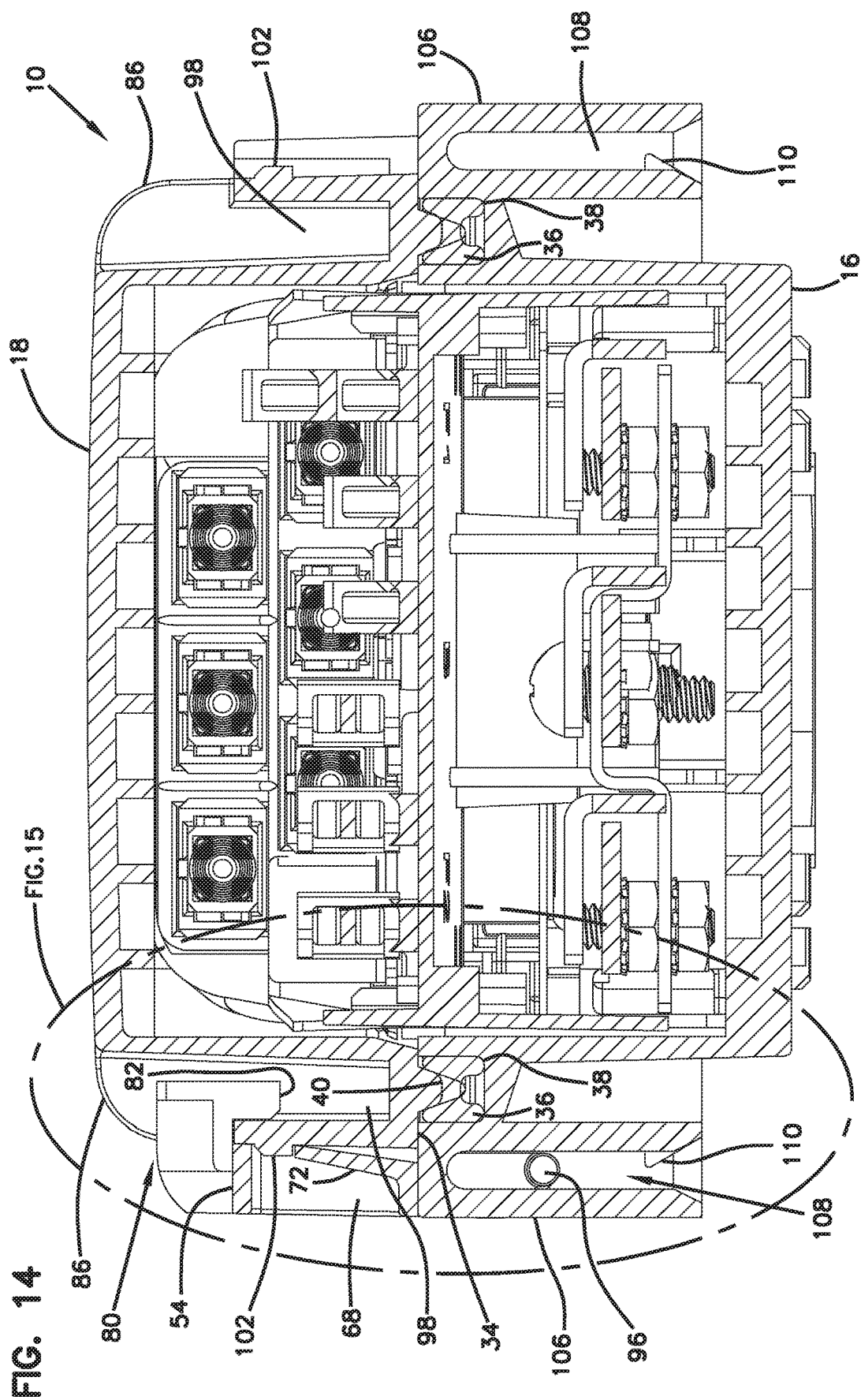
FIG. 14 is a cross-section view taken along section line 15-15 of FIG. 2.

Turning to FIGS. 14-15, a cross-sectional view of the enclosure 10 is shown with the hinge 48 mounted thereon. One of the first and second housing pieces 16, 18 may be arranged and configured with the hinge mounting interface 100 (e.g., hinge mounting locations) and the other one of the first and second housing pieces 16, 18 may be arranged and configured with a guiding assembly 106. The guiding assembly 106 may be integral with (e.g., formed in one seamless piece with) or coupled to, the first and second housing pieces 16, 18, although alternatives are possible. The guiding assembly 106 defines a recess channel 108 (e.g., hinge pin receptacle).

The guiding assembly 106 may be positioned on the other one of the first and second housing pieces 16, 18 at the first side 24, the second side 26 or the first end 14 of the enclosure 10. Thus, the hinge 48 may be selectively mounted at the guiding assembly 106 at the first side 24, the second side 26, or the first end 14 of the enclosure 10.

Figure 16:
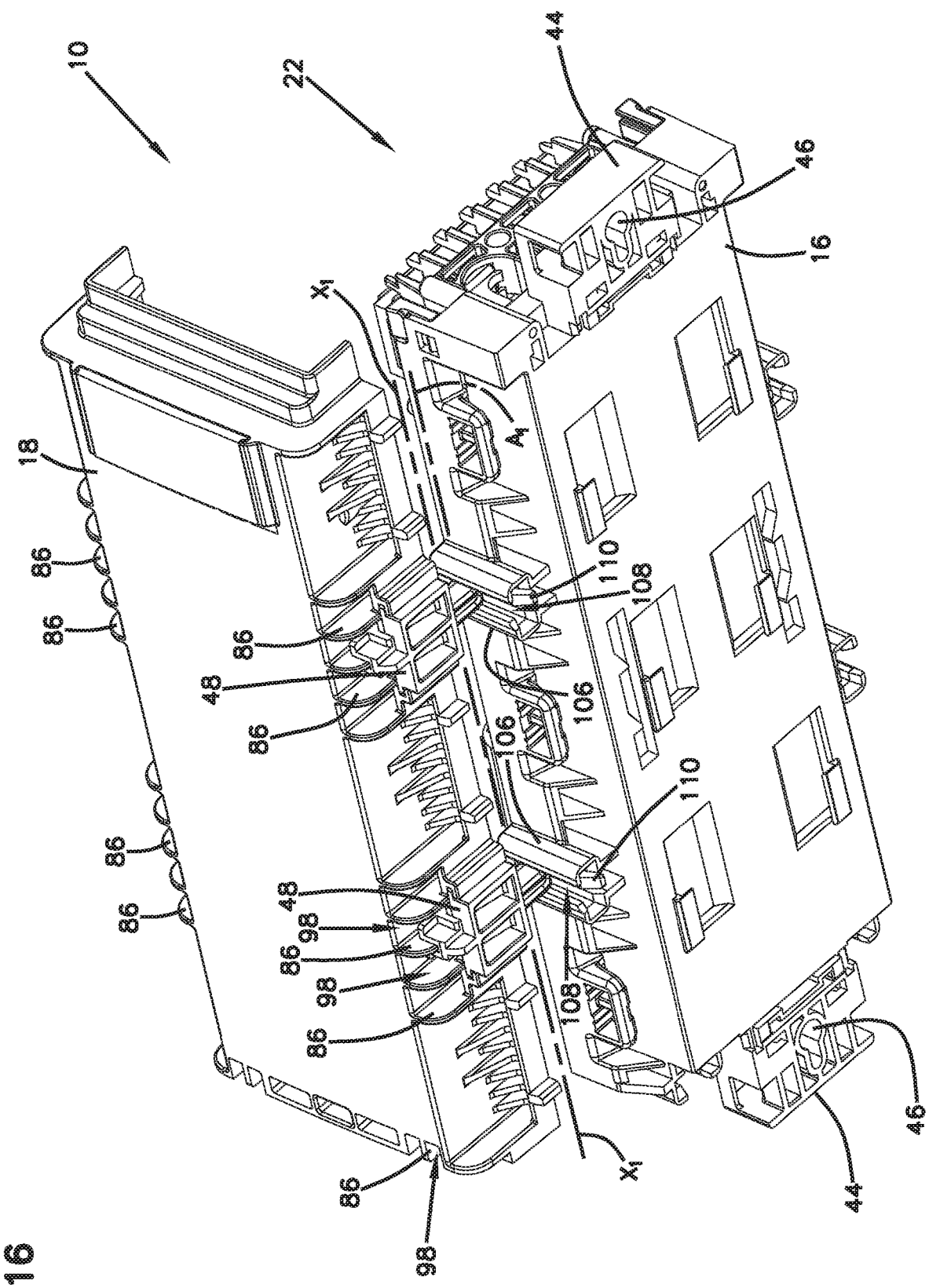
FIG. 16 is a bottom perspective view of the telecommunications enclosure of FIG. 3 showing the cover pivoted to an open position relative to the base in accordance with the principles of the present disclosure.

In the example depicted, the first housing piece 16 is depicted with the guiding assembly 106. As shown in FIG. 16, at least two guiding assemblies 106 can be formed at a side of the first housing piece 16. It will be appreciated that the guiding assembly 106 may be configured at any number of sides of the first housing piece 16 except for the first end 12 where the cable ports 28 are located. That is, the guiding assembly 106 can be located at the first side 24, the second side 26, or the second end 14 of the enclosure 10.

As depicted, the first member 50 is mounted to the second housing piece 18, and the second member 52 is mounted to the first housing piece 16, although alternatives are possible. In use, the recess channel 108 can be adapted to receive the pivot pin 96. The second member 52 can be mounted to the first housing piece 16 by sliding the pivot pin 96 of the pivoting arm 90 through the recess channel 108 of the guiding assembly 106. When the pivot pin 96 is inserted into the recess channel 108, the pivot pin 96 slides over a spring loaded finger 110 positioned within the recess channel 108. Once the pivot pin 96 is captivated within the recess channel 108, the pivot pin 96 cannot be removed from the recess channel 108 unless a sufficient downward force is applied to deflect the spring loaded finger 110.

In certain examples, the pivot pin 96 can be arranged and configured to slide and pivot within the recess channel 108 when one of the first and second housing pieces 16, 18 is rotated and/or translated relative to the other one of the first and second housing pieces 16, 18.

In certain examples, the pivoting arm 90 and the pivot pin 96 provides translation of one of the first and second housing pieces 16, 18 in the X and Y directions such that one of the first and second housing pieces 16, 18 can pivot toward the first position on the other one of the first and second housing pieces 16, 18 to achieve a uniform compression of the elastomeric sealing member 36.

Figure 17:
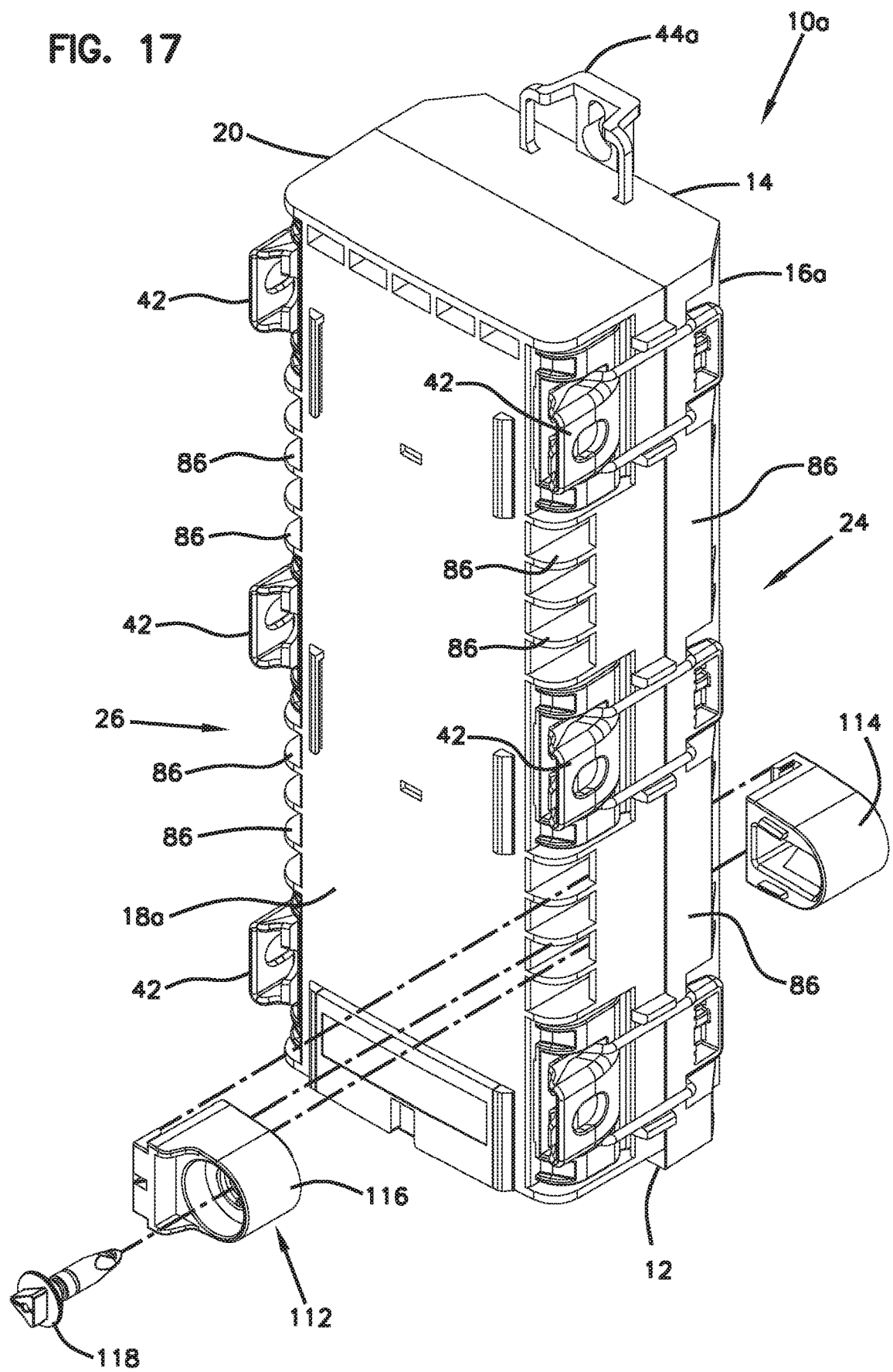
FIG. 17 is perspective view of another example telecommunications enclosure showing an exploded view of a modular locking device in accordance with the principles of the present disclosure.
Figure 18:
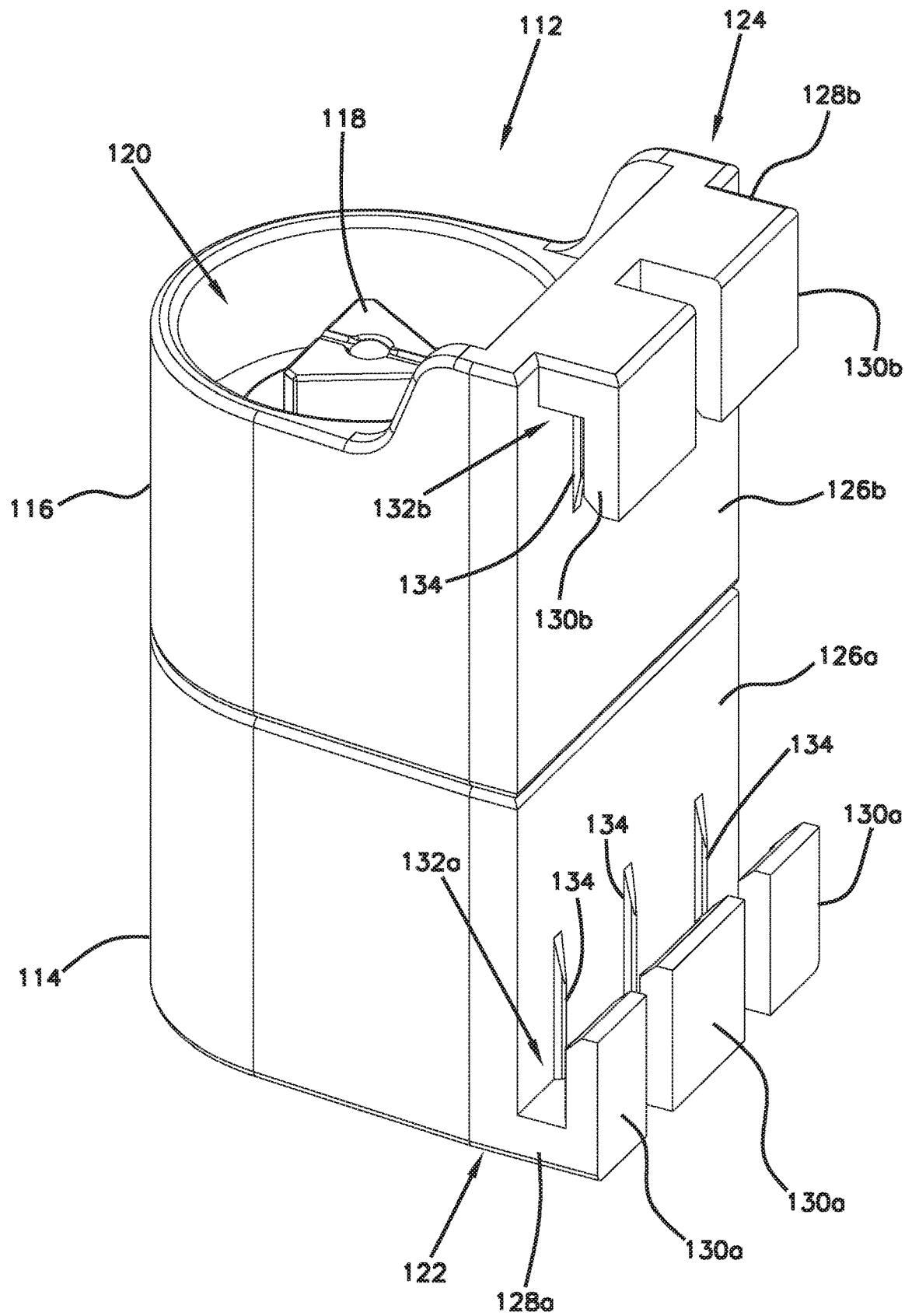
FIG. 18 is a perspective view of the modular locking device of FIG. 17.

Turning to FIGS. 17-18, another example telecommunications enclosure 10a with a housing 20a is depicted in accordance with the principles of the present disclosure. In certain examples, a modular locking device 112 (See FIG. 18) may be utilized as an add-on feature to the telecommunications enclosure 10a to provide added security and limit access to an interior 22 of the housing 20a of the enclosure 10a. That is, the modular security lock 112 may be a separate piece adapted to be mounted to the telecommunications enclosure 10a as desired. The advantageous feature of having a separate security lock eliminates the need to stock multiple enclosures with or without this added security.

In certain examples, the modular locking device 112 may be adapted to mount to the housing 20a between the spaced latches 42. For example, the modular locking device 112 may be mounted to the housing 20a rather than the hinge 48 at the hinge mounting interface 100. The modular locking device 112 may include a first locking member 114 mountable to a first housing piece 16a of the enclosure 10a and a second locking member 116 mountable to a second housing piece 18a of the enclosure 10a. The first and second locking members 114, 116 may each be a unitary molded plastic part. A locking element 118 (e.g., securing element, such as, but not limited to a screw, bolt, or other locking mechanism) may be used to secure the first and second locking members 114, 116 together such that the enclosure 10a is prevented from being opened. The locking element 118 can be adapted to couple the first and second locking members 114, 116 together when the second housing piece 18 is in the closed position. In use, the locking element 118 securely locks the first and second housing pieces 16, 18 together. That is, during use, the locking element 118 prevents the second housing piece 18 from moving from the closed position to the open position.

The second locking member 116 has a recessed top 120. The first locking members 114 can include a first hook member 122 and the second locking member 116 can include a second hook member 124. The first and second hook members 122, 124 can respectively include a face plate 126a, 126b, a horizontal member 128a, 128b extending in a transverse direction relative to respective face plates 126a, 126b, and leg members 130a, 130b extending parallel to respective face plates 126a, 126b to define respective hook receptacles 132a, 132b that are adapted to mount to the first and second housing pieces 16, 18. For example, the hook receptacles 132a may be adapted to receive external structure 86 on the first housing piece 16 and the hook receptacles 132b may be adapted to engage respective receptacles 98 defined by the external structures 86 of the second housing piece 18. The first and second face plates 126a, 126b may each include ribs or flexible tabs 134 that respectfully extend outwardly therefrom for frictionally engaging the enclosure 10a when the first and second locking members 114, 116 are mounted thereto.

In certain examples, a locking element may be a padlock that can be used to couple the first and second locking members 114, 116 together. In other examples, the securing element may include hooks, loops, a band, a strand, or a zip tie for coupling the first and second locking members 114, 116 together. Example modular locking devices is disclosed by U.S. Provisional Patent Application No. 62/661,204, which is hereby incorporated by reference in its entirety.

Figure 19:
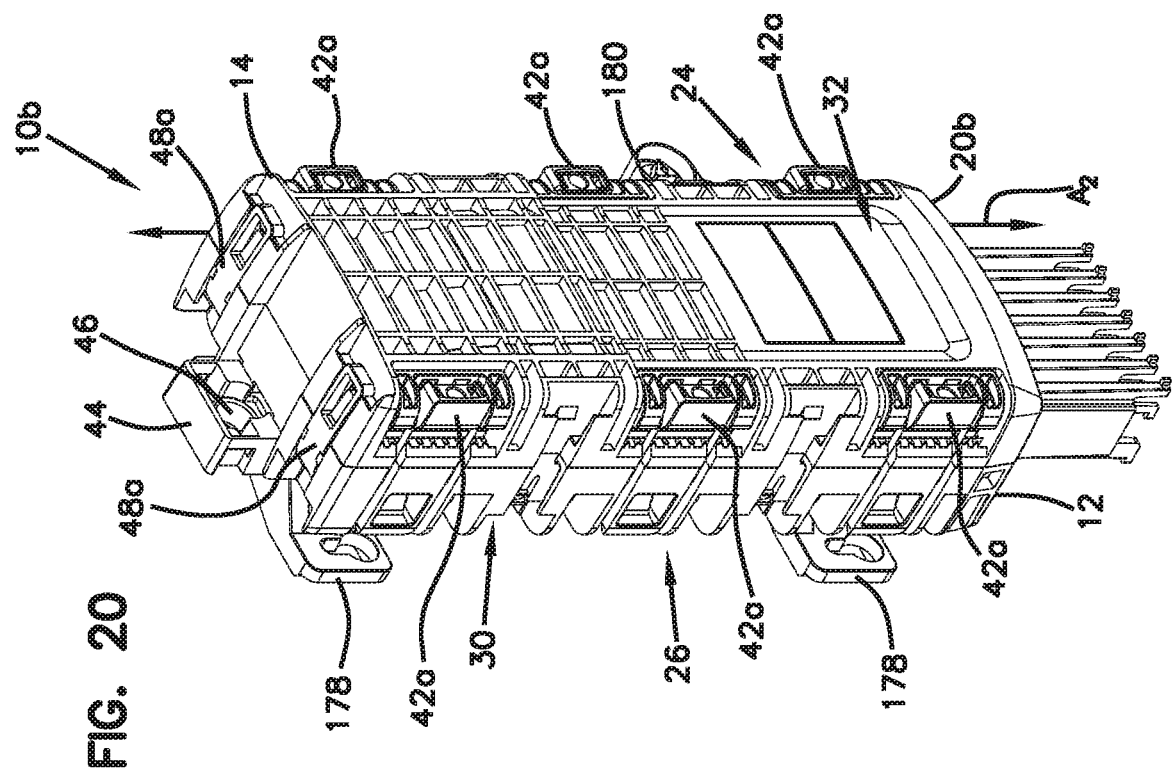
FIG. 19 is a right perspective view of another example telecommunications enclosure in accordance with the present disclosure, the enclosure includes another example hinge in accordance with the present disclosure shown mounted at a side of the enclosure.
Figure 20:
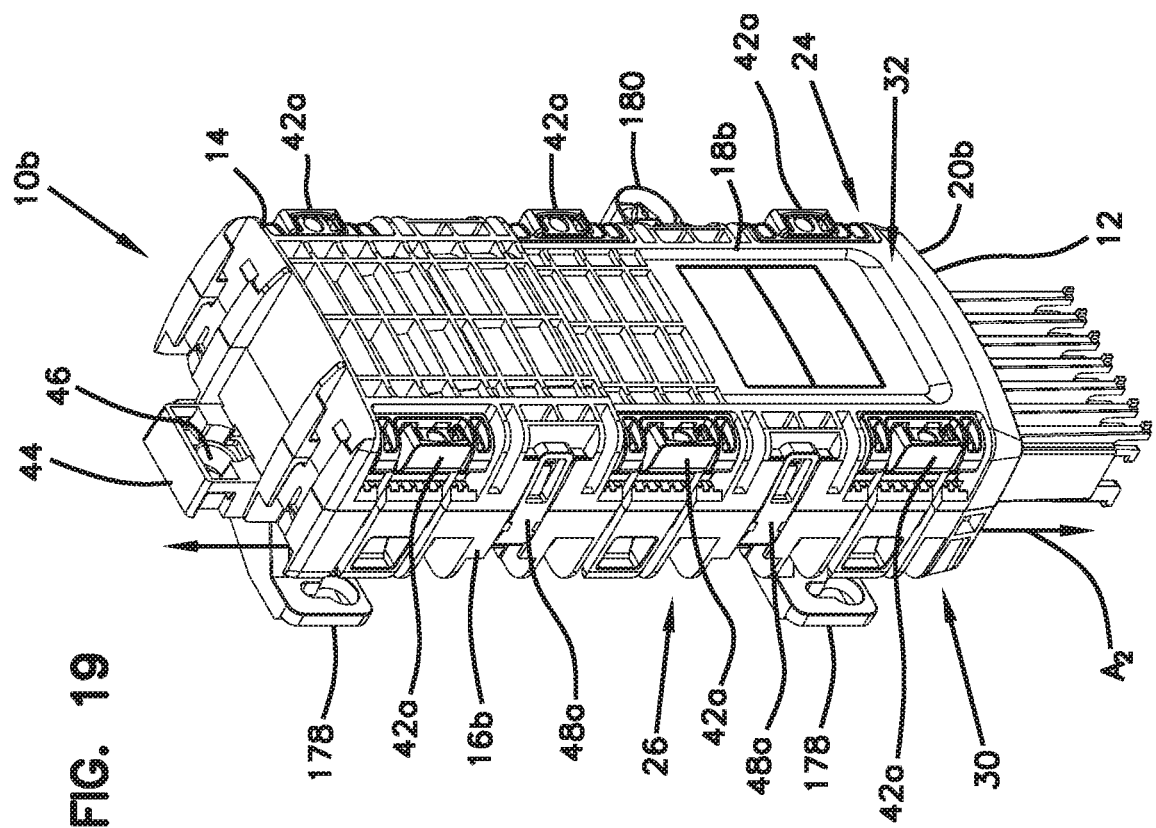
FIG. 20 is a right perspective view of the telecommunications enclosure of FIG. 19 with the hinge mounted to a top side of the enclosure.

Turning to FIGS. 19-20, another example telecommunications enclosure 10b including a housing 20b is depicted in accordance with the principles of the present disclosure. The housing 20b is elongate along a major axis $A_2$ of the housing 20b. The major axis $A_2$ extends along a length of the housing 20b between first and second opposite ends 12, 14. The housing 20b may be preferably re-enterable and environmentally sealed.

The housing 20b includes a first housing piece (e.g., a base) 16b and a second housing piece (e.g., a cover) 18b that cooperate together to define an interior 22 (see FIG. 30) of the housing 20b. The first housing piece 16b can be moveable relative to the second housing piece 18b between a first position (e.g., an open position) (see FIGS. 29-30) and a second position (e.g., a closed position) (see FIG. 19). In certain examples, the first housing piece 16b is pivotally movable relative to the second housing piece 18b between the first and second positions. The housing 20b of the enclosure 10b includes a first side 24 and an opposite, second side 26 that extend between the first and second ends 12, 14. The first and second housing pieces 16b, 18b cooperate to form the first and second sides 24, 26 of the enclosure 10b. The second end 14 (e.g., third side) of the housing 20b is generally solid (i.e., does not define cable ports). The first end 12 (e.g., fourth side) of the housing 20b may define at least one sealed cable pass-through port 28 (see FIG. 30). For other examples, such as straight-pass through examples, the second end may have cable ports.

In certain examples, the first housing piece 16b forms a bottom 30 of the enclosure 10b and the second housing piece 18 forms a top 32 of the enclosure 10b. It will be appreciated that the first housing piece 16b may form the top 32 of the enclosure 10b and the second housing piece 18b may form the bottom 30 of the enclosure 10b. The first housing piece 16b and the second housing piece 18b may be injection-molded plastic components. Alternatively, the first housing piece 16b and the second housing piece 18b may be composed of aluminum and formed by a casting process, for example. It should be understood that the first and second housing pieces 16b, 18b may be composed of any material and made by any forming process known to those skilled in the art without departing from the scope of the present disclosure.

The first and second housing pieces 16b, 18b can meet at a sealing interface 34 (see FIG. 30) that forms a perimeter seal between the first and second housing pieces 16b, 18b when the first and second housing pieces 16b, 18b are fitted (e.g., mated) together. The sealing interface 34 includes an elastomeric sealing member 36 (e.g., gasket or sealing ring) (see FIG. 30) that can be arranged in a continuous loop. The elastomeric sealing member 36 fits within a sealing channel 38 of the first housing piece 16b. In certain examples, the elastomeric sealing member 36 can be disposed between the first and second housing pieces 16b, 18b around the perimeter of the enclosure 10b.

Figure 33:
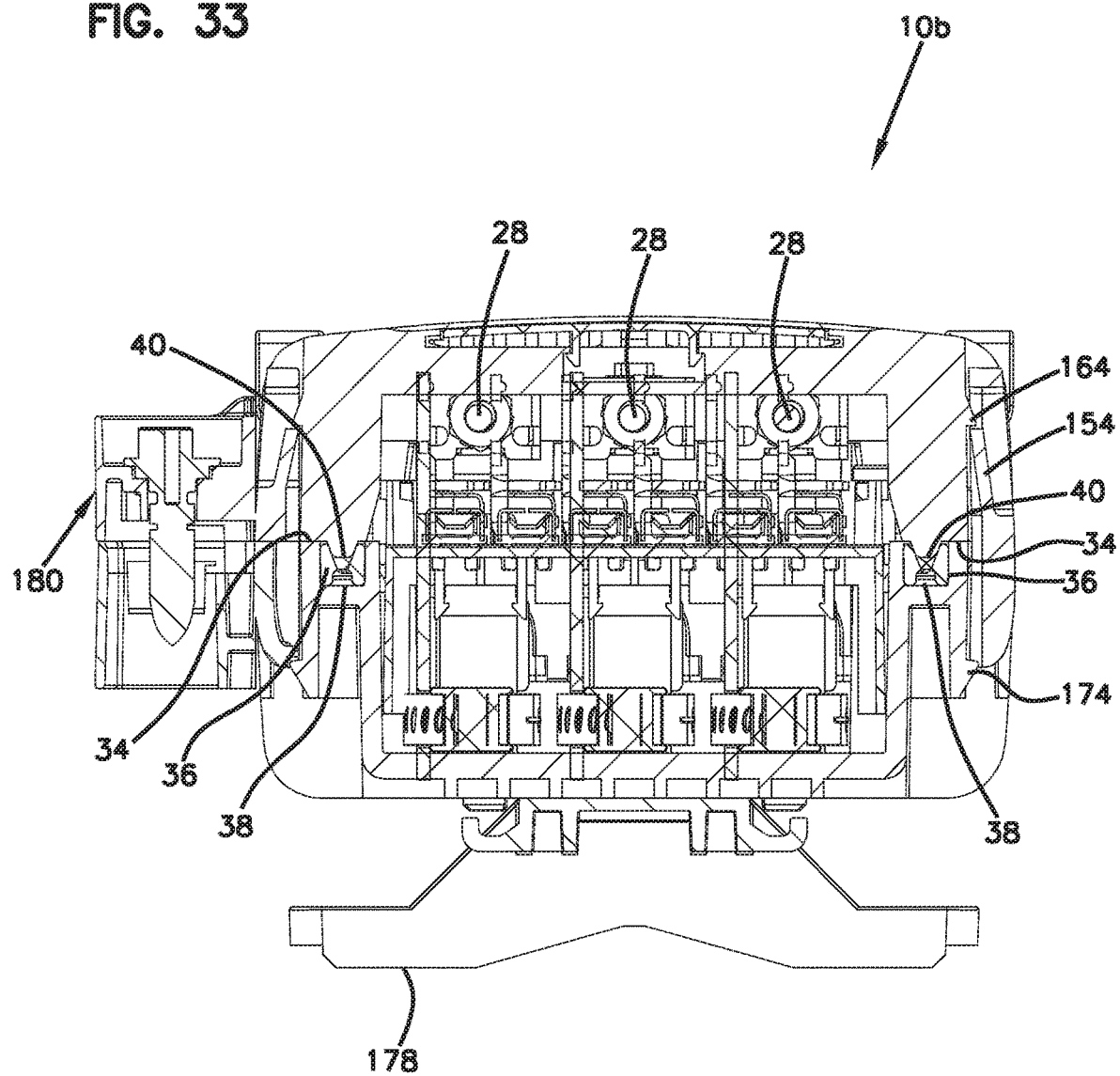
FIG. 33 is a cross-section view taken along section line 33-33 of FIG. 31.

In certain examples, the second housing piece 18b can include a sealing rib 40 (e.g., tongue) (see FIG. 33). In use, the sealing rib 40 can project into the sealing channel 38 and engage (e.g., compress) the elastomeric sealing member 36 in the sealing channel 38 when the first and second housing pieces 16b, 18b are fitted together. In other examples, the second housing piece 18b may define a second channel instead of the sealing rib 40 to accommodate the elastomeric sealing member 36. In still other examples, the second housing piece 18b may define the channel and the first housing piece 16b may define the sealing rib. The elastomeric sealing member 36 inhibits dirt, water, or other contaminants from entering the enclosure 10b when the second housing piece 18b is secured to the first housing piece 16b.

In certain examples, the second housing piece 18b can be secured to the first housing piece 16b using latching arrangements 42a. The latching arrangements 42a can be spaced about a perimeter of the housing 20b to clamp the second housing piece 18b in the first position relative to the first housing piece 16b. For example, in certain implementations, each latching arrangement 42a is configured to releasably latch the second housing piece 18b to the first housing piece 16b. The latching arrangements 42a can be arranged and configured on both the first and second sides 24, 26 of the enclosure 10b.

In certain examples, at least one of the latching arrangements 42b can be disposed on at least one of a plurality of sidewalls of the enclosure 10b for securing the first and second housing pieces 16b, 18b together in the first position. In certain examples, a plurality of spaced latching arrangements 42b can be disposed on at least one of the plurality of sidewalls of the enclosure 10b. It should be understood that once the latching arrangements 42b are released, the second housing piece 18b can be detached from the first housing piece 16b. That is, by opening the latching arrangements 42b, the housing 20b can be moved to the second position of FIGS. 29-30.

In certain examples, the housing 20b includes a mounting structure 44 to hold the housing 20b to a pole, wall, or other surface. In certain examples, the mounting structure 44 defines a fastener opening 46 therethrough. In certain examples, the mounting structures 44 can be positioned at the first and second ends 12, 14 of the housing 20b.

The housing 20b may also include a cable sealing arrangement (not shown) for forming seals about cables (e.g., feeder cables and/or drop cables) routed into the interior 22 of the enclosure 10b such that the cable entry end of the enclosure 10b is sealed. The sealing arrangement can include a cable sealing arrangement at the first end 12 of the housing 20b. The cable sealing arrangement can include a rear gel volume mounted in the first housing piece 16b, a front gel volume mounted in the second housing piece 18b. In certain examples, an intermediate gel volume can be positioned between the front and rear gel volumes.

A management unit (not shown) may be mounted within the interior 22 of the housing 20b. The enclosure 10b is adapted to receive telecommunications hardware for splicing. The management unit may include a tray, splice mounting components, a bank of adapters mounted at an adapter mounting location that may be covered by the tray when the tray is in the closed position and may be accessible from the rear of the management unit when the tray is in the open position. Drop cables with connectorized ends can plug into the fiber optic adapters. An example enclosure having a management unit and an example sealing arrangement is disclosed by U.S. Provisional Patent Application No. 62/630,155, which is hereby incorporated by reference in its entirety.

Figure 22:
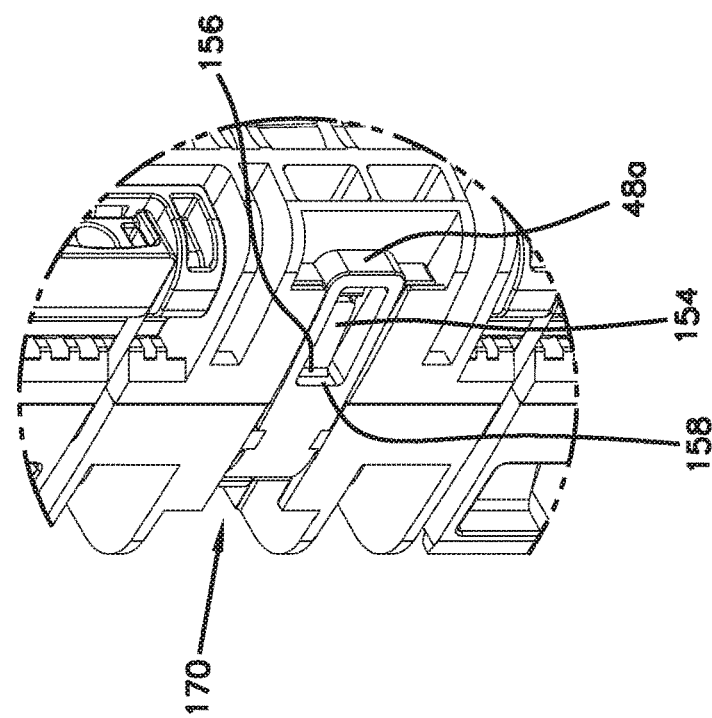
FIG. 22 is an enlarged view of a portion of FIG. 21 showing the hinge mounted to the telecommunications enclosure in accordance with the principles of the present disclosure.
Figure 21:
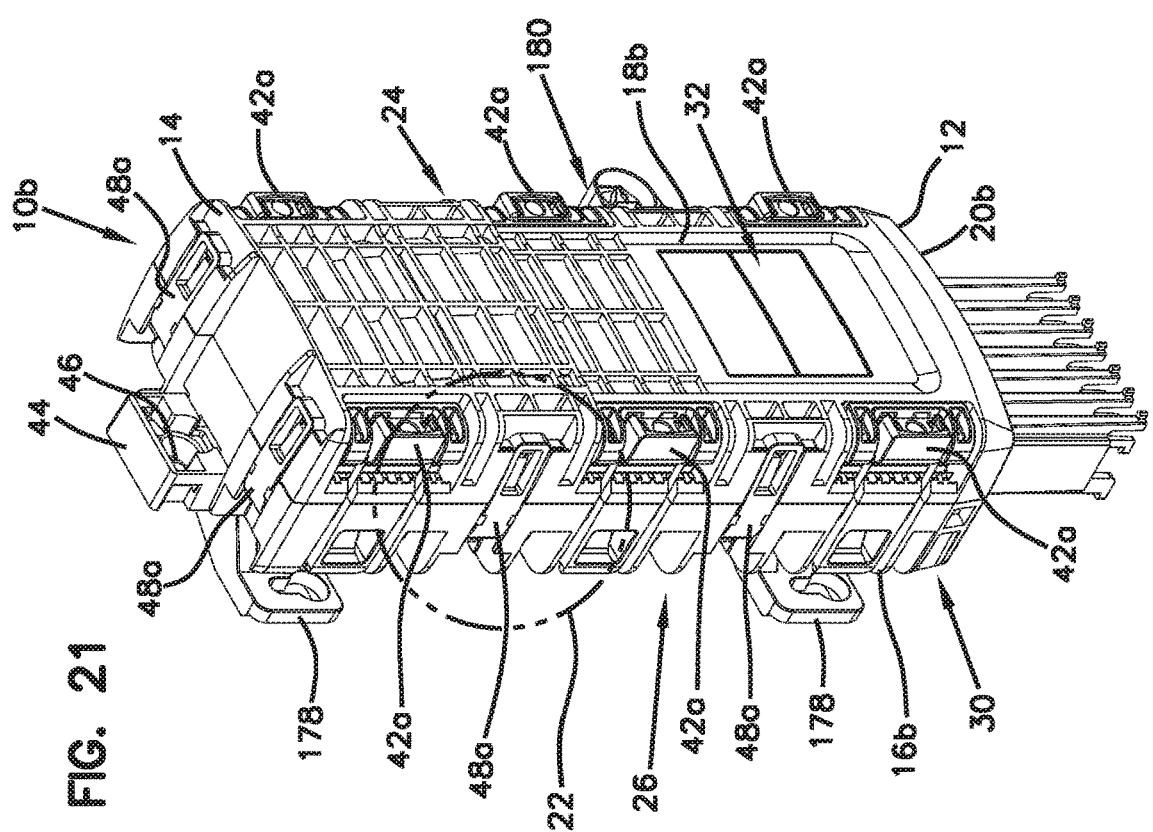
FIG. 21 is a right perspective view of the telecommunications enclosure of FIG. 19 with the hinge mounted to both top and side of the enclosure.
Figure 23:
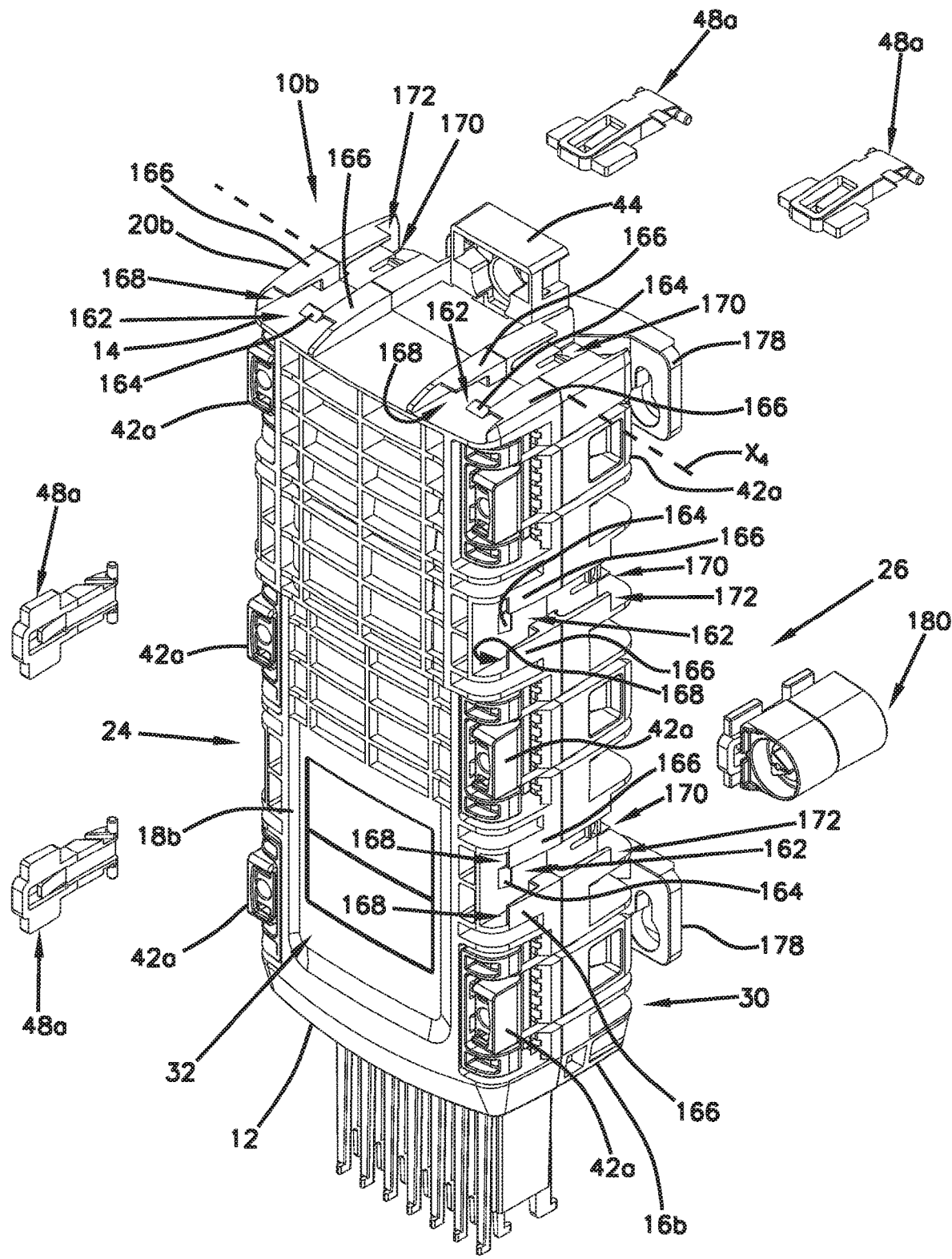
FIG. 23 is a left perspective view of the telecommunications enclosure of FIG. 21 showing the hinges and a modular locking device in accordance with the principles of the present disclosure exploded therefrom.

Turning to FIGS. 21-23, the second housing piece 18b can be hingedly coupled to the first housing piece 16b of the telecommunications enclosure 10b to pivot about an axis of rotation $A_3$ (see FIG. 29) between the second position (see FIGS. 29-30) and the first position. In certain examples, the hinge 48a may have a structure that provides a pivot stop that limits the range of pivot rotation between the first and second positions. In certain examples, the structure can be configured to provide a pivot stop at 90 degrees, although alternatives are possible. In certain examples, the structure can be configured to stop the pivot motion at 180 degrees, although alternatives are possible. In certain examples, the second housing piece 18b can be non-pivotally connected to the first housing piece 16b such that the second housing piece 18b is removable from the first housing piece 16b without pivoting therefrom. That is, the first and second housing pieces 16b, 18b may be connected by the latching arrangements 42a such that by unlatching the latching arrangements 42a, the first housing piece 16b can be removed from the second housing piece 18b without pivoting.

In certain examples, the second housing piece 18b can be pivotally connected to the first housing piece 16b by a hinge 48a. In certain examples, at least two hinges 48a may be used to pivotably couple the second housing piece 18b to the first housing piece 16b along the axis of rotation $A_3$. It should be understood that the enclosure 10b may include any number of hinges.

In certain examples, the hinge 48a may be commonly referred to as a floating, sliding, centering or self-centering hinge, although alternatives are possible. In certain examples, the sliding/floating feature of the hinge 48a may be optional. That is, non-floating hinges may also be used. The hinge 48a can be configured to accommodate relative translation and/or rotation of one of the first housing piece 16b or the second housing piece 18b. The hinge 48a can be configured to also accommodate translation of the second housing piece 18b with respect to the first housing piece 16b upon pivoting the second housing piece 18b to the first position to achieve uniform compression of the elastomeric sealing member 36 along its circumference. The hinges 48a may be configured to rotate or have a combination of rotation and translation features. In certain examples, the hinge 48a can be manufactured of a polymeric material, although alternatives are possible.

The hinges 48a may be removably attached to the enclosure 10b at any number of sides of the housing 20b except for the first end 12 where the cable ports 28 are defined. In certain examples, the hinges 48a may be mounted to the housing 20b on at least two different sides thereof. In certain examples, the hinges 48a may be mounted at the first side 24, at the second side 26, or at the second end 14 of the housing 20b. When the hinges 48a are mounted at either the first side 24 or the second side 26 of the enclosure 10b, a hinge axis $X_3$ (see FIG. 30) of the housing 20b may be parallel to the major axis $A_2$ of the housing 20b. When the hinges 48a are mounted at the second end 14 of the enclosure 10b, a hinge axis $X_4$ (see FIG. 23) of the housing 20b may be perpendicular to the major axis $A_2$ of the housing 20b.

The hinges 48a can be separate pieces that may or may not be added to customize telecommunications enclosures. The hinges 48a may be utilized to provide a variety of flexible designs for telecommunications enclosures. The hinges 48a may be mounted on the telecommunications enclosure 10b in the field as desired to optimize access into the interior 22 thereof. In certain examples, the hinges 48a may be mounted to the housing 20b between the spaced latching arrangements 42a.

Turning to FIGS. 24-28, multiple perspective views of the hinge 48a is depicted. The hinge 48a may include a main body 140 that defines an opening 142 (e.g., slot) at a proximal end 144 of the main body 140 opposite a distal end 146 of the main body 140. The main body 140 includes first and second mounting flanges 148a, 148b (e.g., first member) that extend outwardly from respective first and second sides 150, 152 thereof. The first and second mounting flanges 148a, 148b may be integral with (e.g., formed in one seamless piece with) or coupled to, the main body 140, although alternatives are possible. The opening 142 defined in the main body 140 is located between the first and second mounting flanges 148a, 148b. The first and second mounting flanges 148a, 148b can extend parallel relative to the main body 150, although alternatives are possible.

The hinge 48a also includes a flexible tongue 154 positioned within the opening 142. The flexible tongue 154 can be fixed at one end 156 (see FIG. 22) to an inner wall 158 that defines the opening 142 of the main body 140 such that the flexible tongue 154 is pivotally attached. The flexible tongue 154 can have a free end 160 and extend within the opening 142 from the fixed end 156 to the free end 160. In use, the first and second mounting flanges 148a, 148b may be adapted to mount on the second housing piece 18b of the enclosure 10b, although alternatives are possible. For example, the first and second mounting flanges 148a, 148b of the hinge 48a may be adapted to mount to the first housing piece 16b.

Turning again to FIG. 23, one of the first and second housing pieces 16b, 18b may be arranged and configured with a hinge mounting interface 162 (e.g., hinge mounting location) and the other one of the first and second housing pieces 16b, 18b may be arranged and configured with a guiding assembly 170. The guiding assembly 170 may be integral with (e.g., formed in one seamless piece with) or coupled to, the first and second housing pieces 16b, 18b, although alternatives are possible. The guiding assembly 170 defines a recess channel 172 (e.g., hinge pin receptacle).

The hinge mounting interface 162 can be formed at any number of sides on the first and second housing pieces 16b, 18b except for at the first end 12 that includes the cable ports 28. That is, the hinge mounting interface 162 may be formed at the first side 24, the second side 26 and the second end 14 of the enclosure 10b. In certain examples, the first and second housing pieces 16b, 18b may have the hinge mounting interface 162 formed on at least two different sides of the housing 10b.

The hinge mounting interface 162 may also include protrusions (e.g., bumps, studs, tabs) 164 that extend from a surface of the hinge mounting interface 162. The protrusion 164 provides a connection between the hinge 48a and either one of the first and second housing pieces 16b, 18b. The hinge mounting interface 162 may further include a clamp bracket 166 that defines slots 168. When the hinge 48a is mounted to the hinge mounting interface 162 of one of the first and second housing pieces 16b, 18b, the first and second mounting flanges 148a, 148b can be configured to slidably engage the slots 168 of the clamp bracket 166 and the free end 160 of the flexible tongue 154 can be configured to snap past the protrusion 164 to provide a snap fit connection with either one of the first and second housing pieces 16b, 18b. The first and second mounting flanges 148a, 148b are mounted within the slots 168 of the second housing piece 18b such that the first and second mounting flanges 184a, 148b of the hinge 48a are fixed/non-pivotal relative to the second housing piece 18b. The protrusion 164 can help prevent the hinge 48a from sliding back out of the hinge mounting interface 162. In certain examples, the hinge 48a may be mounted to the housing 20b by friction fit, press-fit, snap-fit connection, and/or adhesive, although alternatives are possible.

Turning again to FIGS. 25-28, the hinge 48a may include pivot pins 96a (e.g., hinge pins, second member) configured to rotate and/or translate the first and second housing pieces 16b, 18b with respect to the other one of the first and second housing pieces 16b, 18b. In certain examples, the hinge 48a may include a single pivot pin 96a. The pivot pins 96a can be partially disposed within an open semi-circular casing 176, although alternatives are possible. When the hinge 48a is mounted to the hinge mounting interface 162 of one of the first and second housing pieces 16b, 18b, the pivot pins 96a can be in sliding engagement with one of the first and second housing pieces 16b, 18b. The pivot pins 96a may be integral with (e.g., formed in one seamless piece with) or coupled to, the main body 140, although alternatives are possible.

Figure 29:
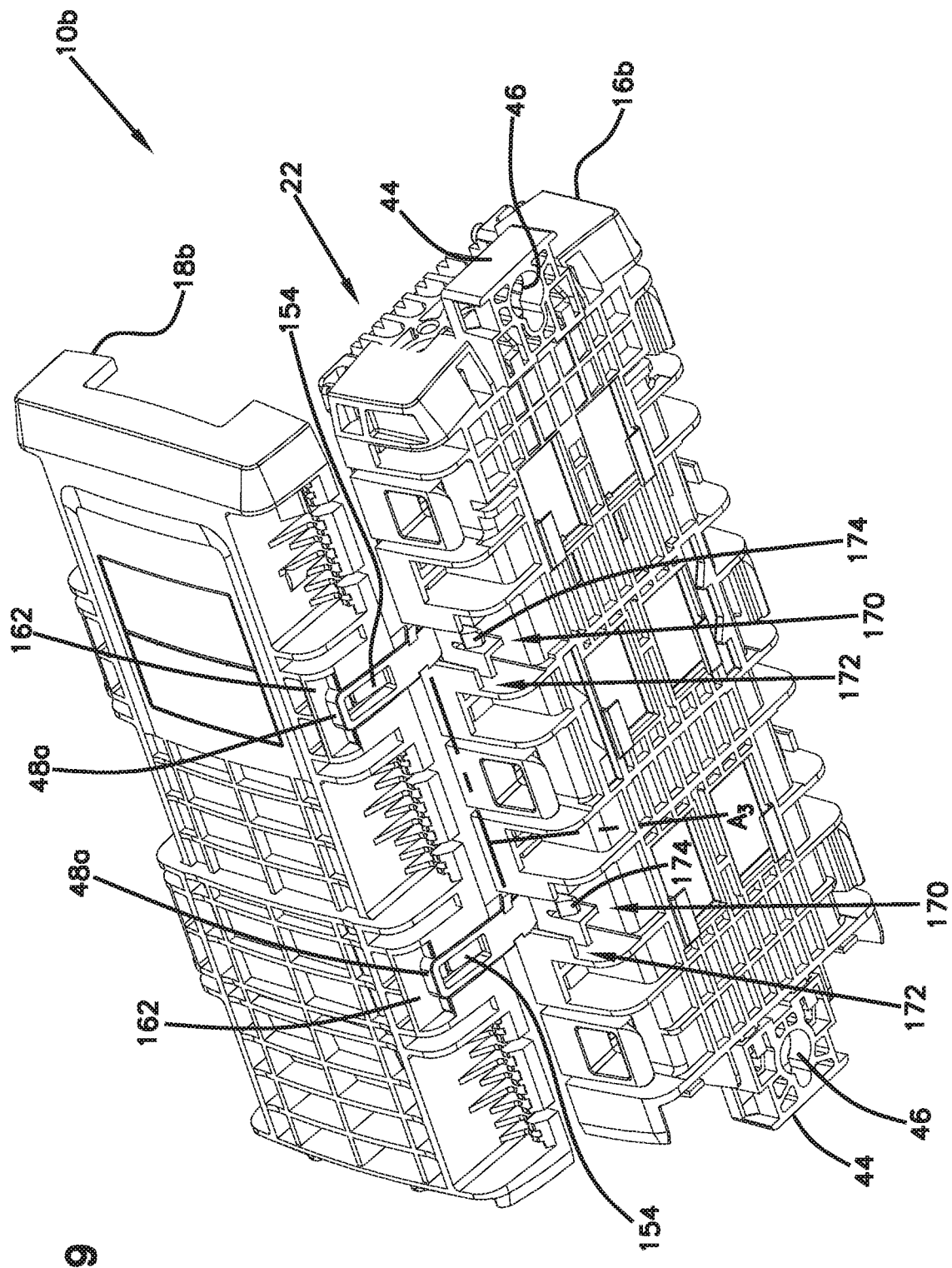
FIG. 29 is a bottom perspective view of the telecommunications enclosure of FIG. 19 showing a cover pivoted to an open position relative to a base in accordance with the principles of the present disclosure.
Figure 30:
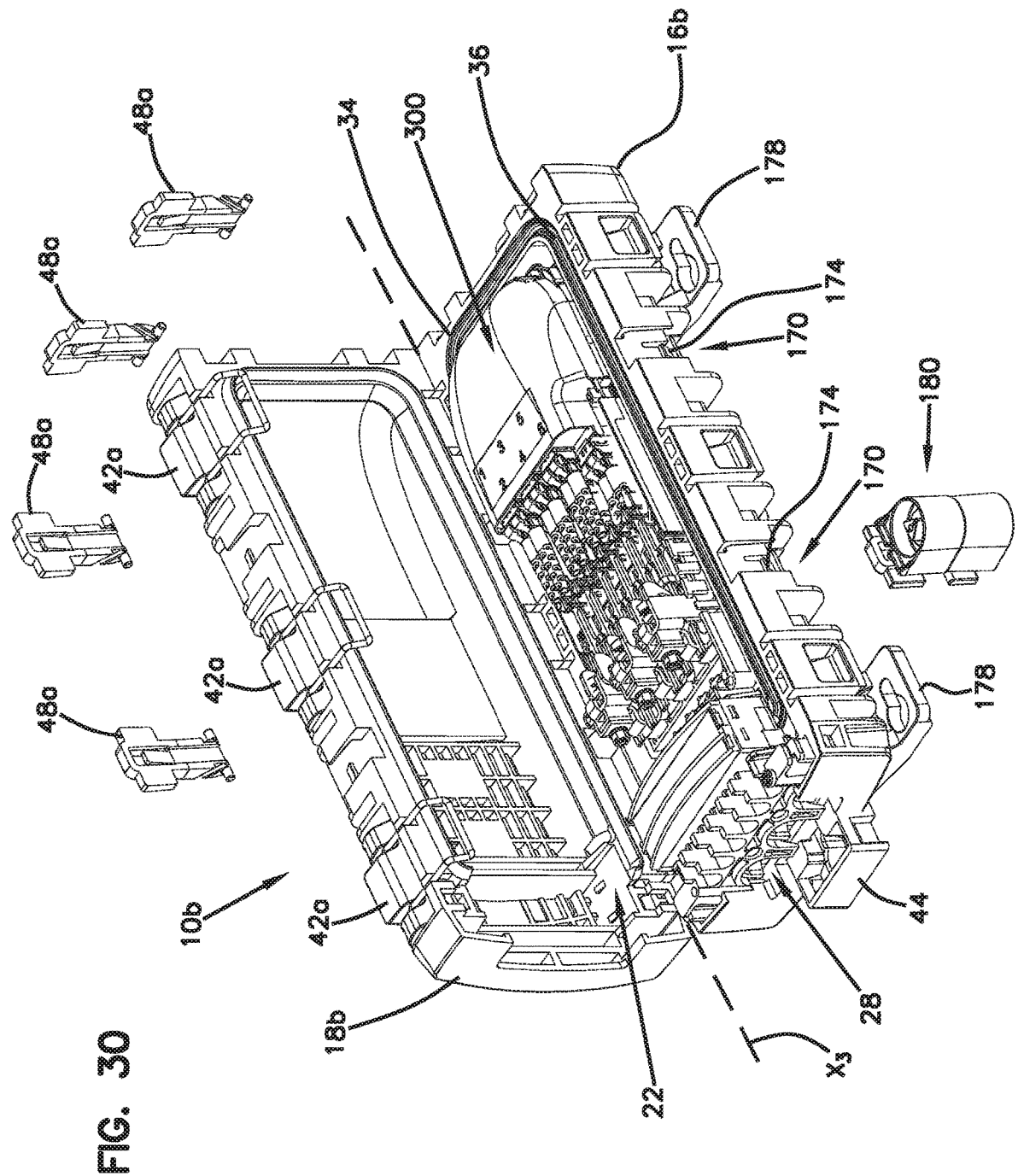
FIG. 30 is a perspective view of the telecommunications enclosure of FIG. 23 showing an interior of the enclosure.

Referring to FIGS. 29-30, the guiding assembly 170 may be positioned on the other one of the first and second housing pieces 16b, 18b at the first side 24, the second side 26 or the first end 14 of the enclosure 10b. Thus, the hinge 48a may be selectively mounted at the guiding assembly 170 at the first side 24, the second side 26, or the first end 14 of the enclosure 10b.

In the example depicted, the first housing piece 16b is depicted with the guiding assembly 170. As shown in FIG. 23, at least two guiding assemblies 170 can be formed at a side of the first housing piece 16b. It will be appreciated that the guiding assembly 170 may be configured at any number of sides of the first housing piece 16b except for the first end 12 where the cable ports 28 are located. That is, the guiding assembly 170 can be located at the first side 24, the second side 26, or the second end 14 of the enclosure 10b.

In use, the recess channel 172 can be adapted to receive the pivot pins 96a. The pivot pins 96a can be mounted to the first housing piece 16b by sliding the pivot pins 96a through the recess channel 172 of the guiding assembly 170. The pivot pins 96a can snap into the recess channel 172 to provide a slideable and pivotal connection. When the pivot pins 96a are inserted into the recess channel 172, the semi-circular casing 176 can slide over a spring loaded finger 174 positioned within the recess channel 172. Once the pivot pins 96a are captivated within the recess channel 172, the pivot pins 96a cannot be removed from the recess channel 172 unless a sufficient downward force is applied to deflect the spring loaded finger 174.

The pivot pins 96a can be adapted to slide up and down within the recess channel 172 of the hinge mounting interface 162 relative to the first housing piece 16b in a direction perpendicular to the pivot axis of rotation $A_3$ to allow the second housing piece 18b to seat evenly on the first housing piece 16b prior to latching. The pivot pins 96a may also float in a direction perpendicular to the pivot axis of rotation $A_3$.

In certain examples, the pivot pins 96a can be arranged and configured to slide and pivot within the recess channel 172 when one of the first and second housing pieces 16b, 18b is rotated and/or translated relative to the other one of the first and second housing pieces 16b, 18b.

In certain examples, the pivot pins 96a provide translation of one of the first and second housing pieces 16b, 18b in the X and Y directions such that one of the first and second housing pieces 16b, 18b can pivot toward the first position on the other one of the first and second housing pieces 16b, 18b to achieve a uniform compression of the elastomeric sealing member 36.

Figure 31:
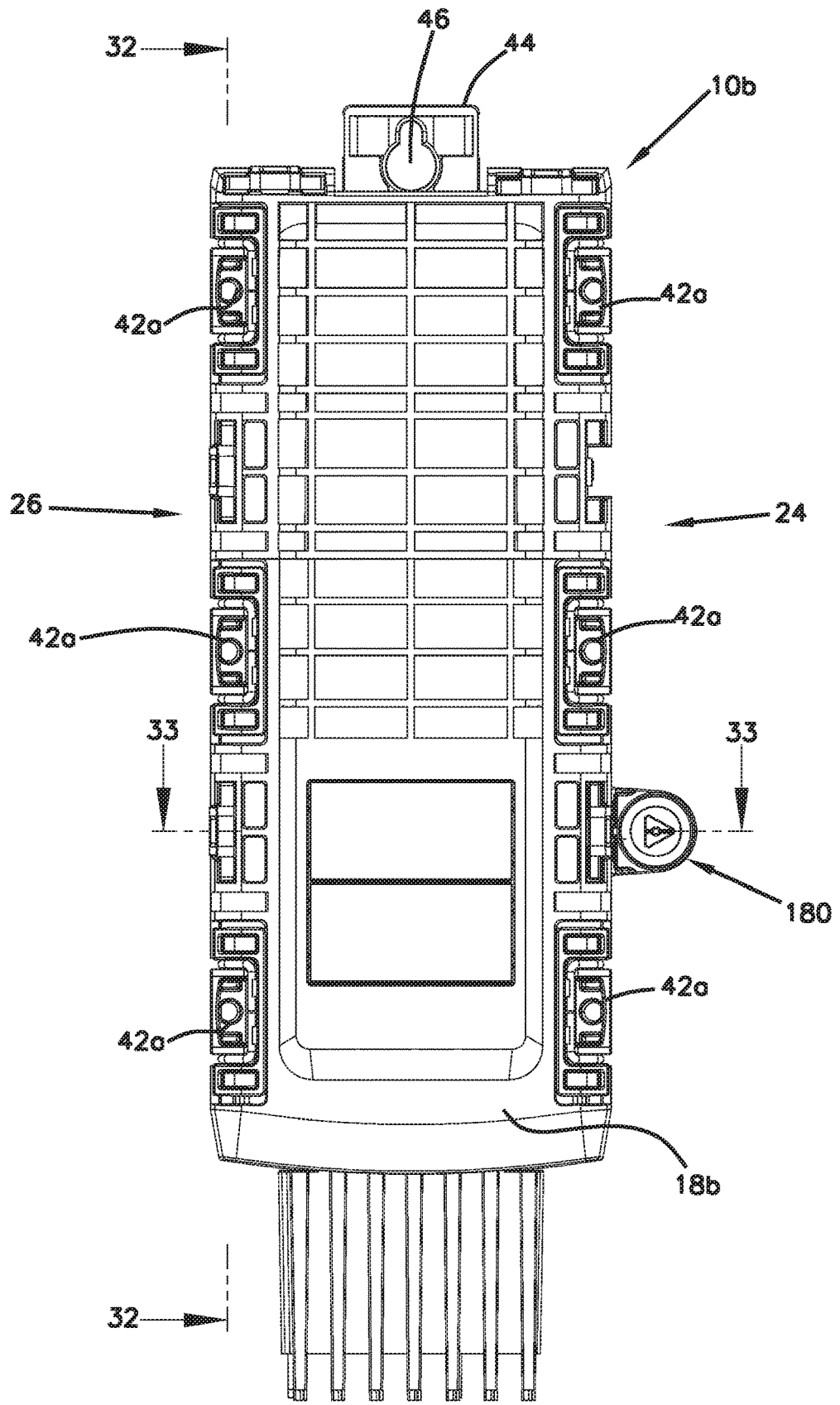
FIG. 31 is a front plan view of the cover of FIG. 29.
Figure 32:
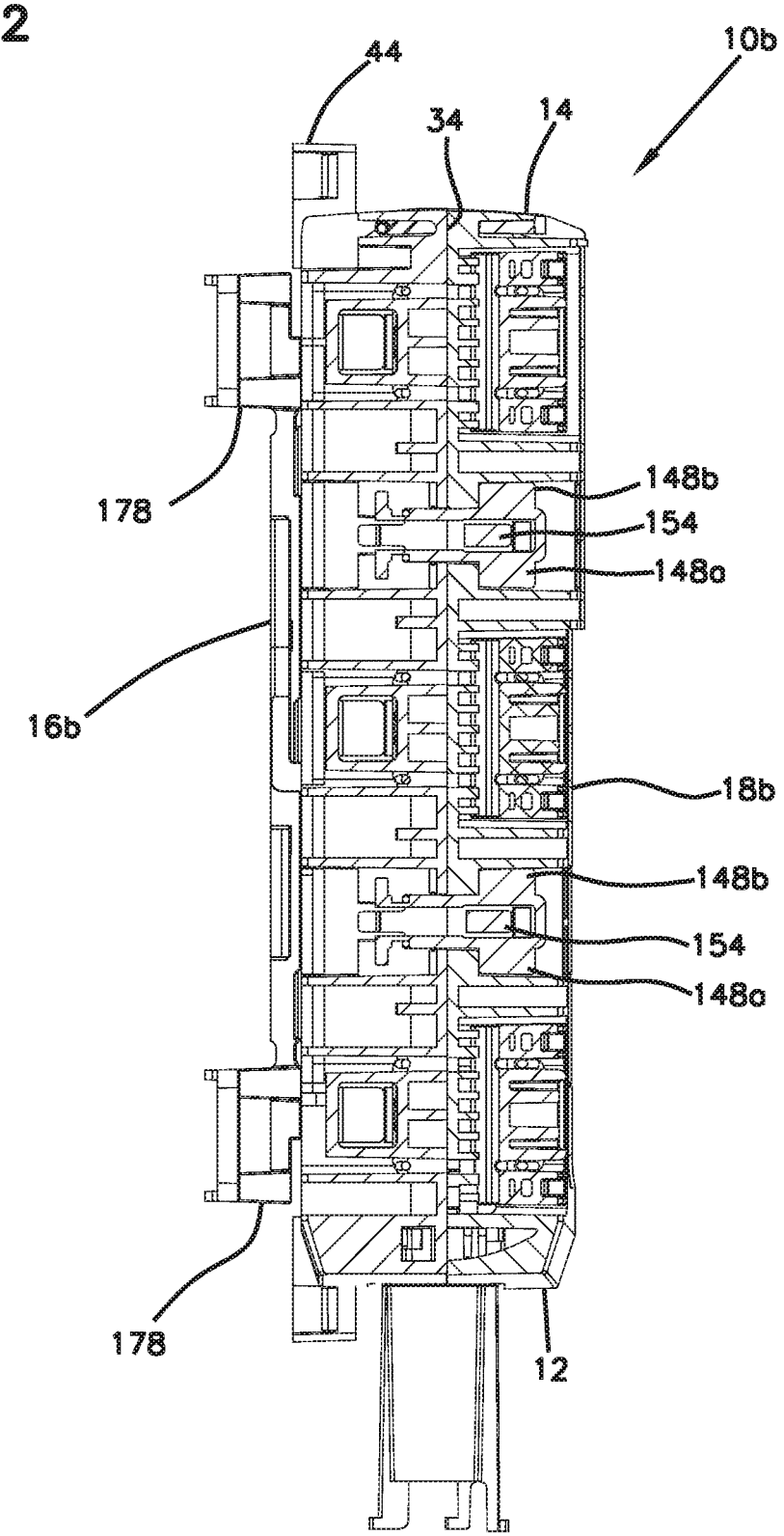
FIG. 32 is a cross-section view taken along section line 32-32 of FIG. 31.

Turning to FIG. 31, a front plan view of the second housing piece 18b of the enclosure 10b is depicted. FIGS. 32-33 show cross-sectional views of the enclosure 10b with the hinge 48a mounted thereon. The enclosure 10b may include brackets 178 for mounting the enclosure 10b to a structure (e.g., wall, cabinet, panel, rack, etc.).

Figure 35:
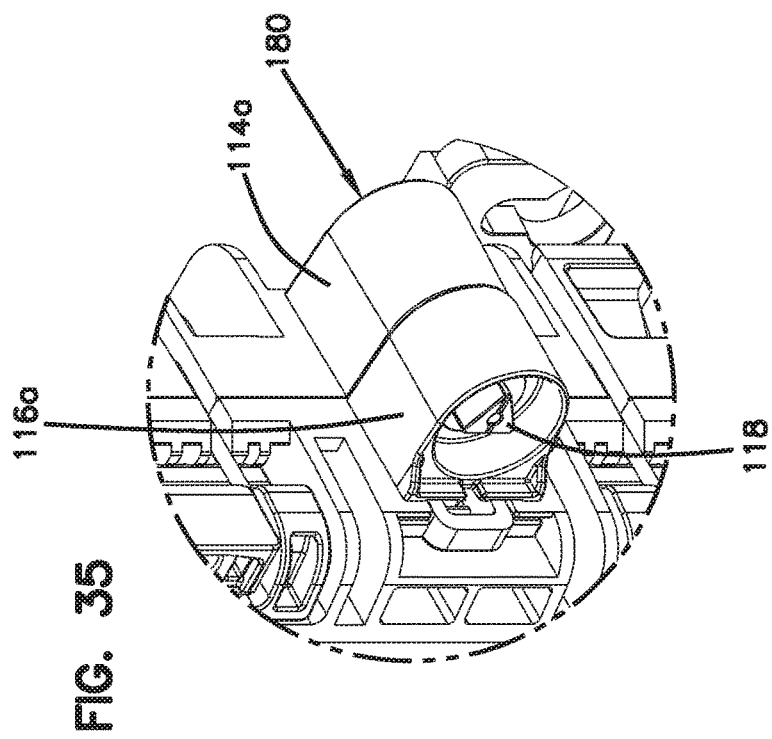
FIG. 35 is an enlarged view of a portion of FIG. 34 showing the modular locking device.
Figure 34:
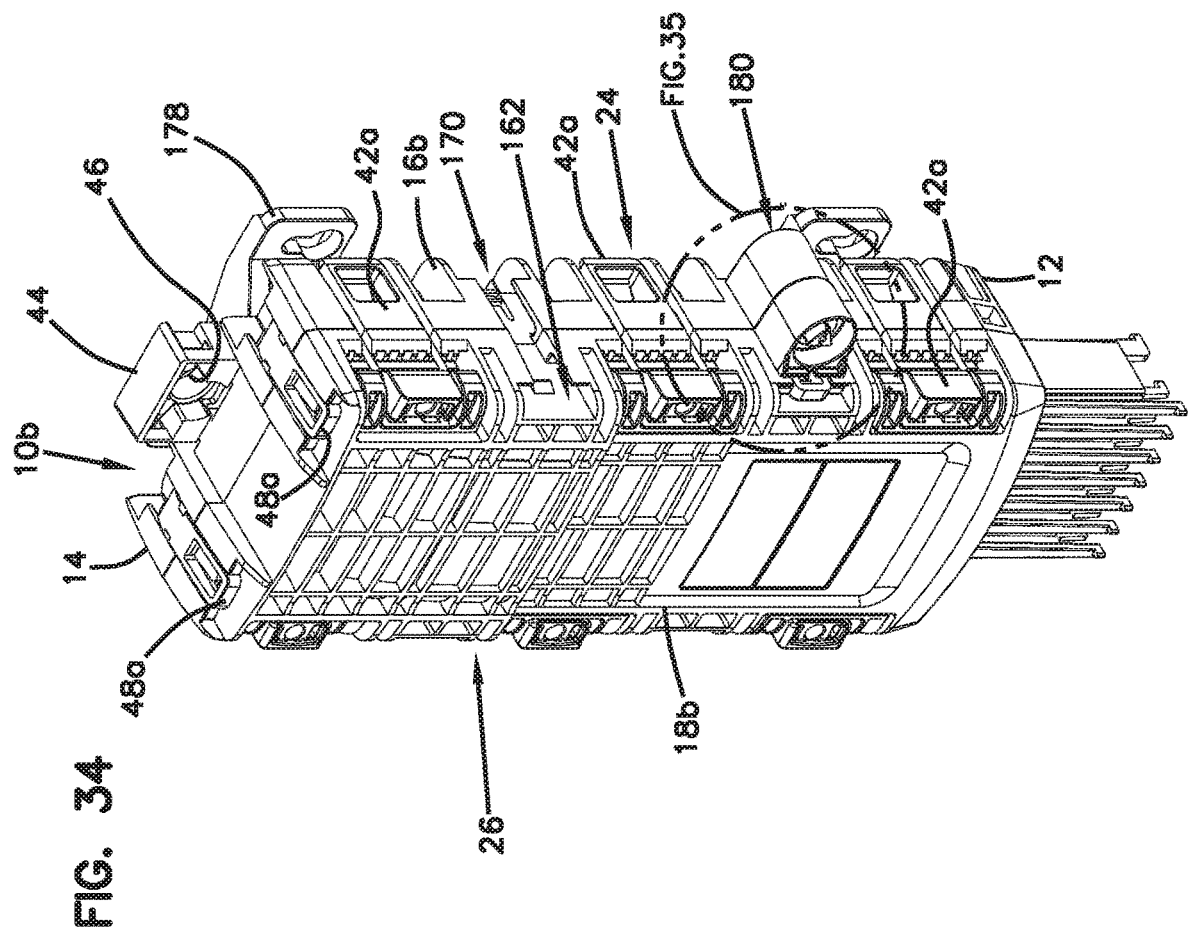
FIG. 34 is a left perspective view of the example telecommunications enclosure of FIG. 21 with the modular locking device in accordance with the principles of the present disclosure.

Turning to FIGS. 34-35, the example telecommunications enclosure 10b is depicted with another example modular locking device 180 in accordance with the principles of the present disclosure. The modular locking device 180 may be utilized as an add-on feature to the telecommunications enclosure 10b to provide added security and limit access to the interior 22 of the housing 20b of the enclosure 10b. That is, the modular security lock 180 may be a separate piece adapted to be mounted to the telecommunications enclosure 10b as desired. The advantageous feature of having a separate security lock eliminates the need to stock multiple enclosures with or without this added security.

In certain examples, the modular locking device 180 may be adapted to mount to the housing 20b between the spaced latches 42a. For example, the modular locking device 180 may be mounted to the housing 20b rather than the hinge 48a at the hinge mounting interface 162. The modular locking device 180 may include a first locking member 114a mountable to the first housing piece 16b of the enclosure 10b and a second locking member 116a mountable to the second housing piece 18b of the enclosure 10b, although alternatives are possible. For example, the first locking member 114a may be configured to mount to the second housing piece 18b of the enclosure 10b and the second locking member 116a may be configured to mount to the first housing piece 16b of the enclosure 10b.

The first and second locking members 114a, 116a may each be a unitary molded plastic part. The locking element 118 (e.g., securing element, such as, but not limited to a screw, bolt, or other locking mechanism) may be used to secure the first and second locking members 114a, 116a together such that the enclosure 10b is prevented from being opened. The locking element 118 can be adapted to couple the first and second locking members 114a, 116a together when the second housing piece 18b is in the closed position. In use, the locking element 118 securely locks the first and second housing pieces 16b, 18b together. That is, during use, the locking element 118 prevents the second housing piece 18b from moving from the closed position to the open position.

Turning to FIGS. 36-39, the second locking member 116a also has a recessed top 120a. The second locking member 116a can be configured with a mating interface 182 similar to the hinge 48a for mounting to one of the first and second housing pieces 16b, 18b. The mating interface 182 can include first and second mounting flanges 184a, 184b that extend outwardly from respective first and second sides 186, 188 thereof. The mating interface 182 of the second locking member 116a defines an opening 190 between the first and second mounting flanges 184a, 184b. A flexible tongue 192 is shown positioned within the opening 190. The flexible tongue 192 can be fixed at one end 194 such that the flexible tongue 192 is pivotally attached. The flexible tongue 192 can have a free end 196 and extend within the opening 190 from the fixed end 194 to the free end 196.

When the second locking member 116a is mounted to the hinge mounting interface 162 of one of the first and second housing pieces 16b, 18b, the first and second mounting flanges 184a, 184b can be configured to slidably engage the slots 168 of the clamp bracket 166 and the free end 196 of the flexible tongue 192 can be configured to snap past the protrusion 164 to provide a snap fit connection with either one of the first and second housing pieces 16b, 18b. The protrusion 164 can help prevent the second locking member 116a from sliding back out of the hinge mounting interface 162. In certain examples, the second locking member 116a may be mounted to the housing 20b by friction fit, press-fit, snap-fit connection, and/or adhesive, although alternatives are possible. In certain examples, the first and second mounting flanges 184a, 184b of the second locking member 116a may be adapted to mount to the first housing piece 16b.

Turning to FIGS. 38-39, the first locking member 114a can include a plate member 198 with an elongated slot 200 and a pair of parallel flange members 202 extending on opposite sides thereof. The pair of parallel flange members 202 can be adapted to mount to the first and second housing pieces 16b, 18b. For example, the pair of parallel flange members 202 can be received within the recess channel 172 for the purpose of mounting the first locking member 114a onto the first housing piece 16b.

In certain examples, a locking element may be a padlock that can be used to couple the first and second locking members 114a, 116a together. In other examples, the securing element may include hooks, loops, a band, a strand, or a zip tie for coupling the first and second locking members 114a, 116a together. Example modular locking devices are disclosed by U.S. Provisional Patent Application No. 62/661,204, which is hereby incorporated by reference in its entirety.

From the forgoing detailed description, it will be evident that modifications and variations can be made without departing from the spirit and scope of the disclosure.

What is claimed is:

1. A telecommunications enclosure arrangement, comprising:
    (a) an enclosure having a plurality of sidewalls, a base, and a cover connected to the base, the base and the cover cooperating to define an interior region, the cover being adapted for movement between an open position and a closed position;
    (b) a plurality of spaced latches disposed on the plurality of sidewalls of the enclosure for securing the base and the cover together in the closed position; and (c) a hinge that is a separate piece from the cover and the base, the hinge being adapted to be mounted on at least one of the plurality of sidewalls of the enclosure for hingedly coupling the cover to the base, the hinge including:
(i) a first member being adapted to mount to the cover of the enclosure and including an anchoring plate with flanges on opposing sides thereof for sliding engagement with slots defined in the cover to provide a connection therebetween; and
(ii) a second member being adapted to mount to the base of the enclosure, the second member including a pivot pin configured to pivot the cover about an axis of rotation between the open position and the closed position, the second member being configured to accommodate translation of the cover with respect to the base upon pivoting the cover to the closed position to compress a seal positioned along a sealing surface of the enclosure and including a pivoting arm that extends downwardly in a direction parallel to the anchoring plate, the pivoting arm having a distal end including the pivot pin adapted to slidably engage a channel defined in the base.

2. The telecommunications enclosure arrangement of claim 1, wherein the plurality of spaced latches are adapted to couple the first and second members together when the cover is in the closed position, wherein, in use, the plurality of spaced latches prevent the cover from moving from the closed position to the open position.

3. The telecommunications enclosure arrangement of claim 1, wherein the hinge is adapted to be positioned between the plurality of spaced latches.

4. The telecommunications enclosure arrangement of claim 1, wherein the hinge is removably attached to the enclosure.

5. The telecommunications enclosure arrangement of claim 1, wherein the seal is formed from an elastomeric material.

6. The telecommunications enclosure arrangement of claim 1, wherein the anchoring plate defines two openings separated by a dividing member, the two openings having respective flexible members therein.

7. The telecommunications enclosure arrangement of claim 6, wherein each one of the flexible members has a proximal end that is fixed at a bottom side of the anchoring plate, the flexible members also having a distal free end that is adapted to releasably engage corresponding tabs positioned on the cover.

8. The telecommunications enclosure arrangement of claim 1, wherein the first member of the hinge further includes an engagement member, the engagement member having two extension members that define an opening to receive a rib on the cover.

9. The telecommunications enclosure arrangement of claim 8, wherein the two extension members each extend in a transverse direction relative to the anchoring plate, and each one of the two extension members has a hook member that extends parallel to the anchoring plate, wherein when the hinge is mounted on the cover, the hook members are adapted to engage respective receptacles defined in the cover.

10. The telecommunications enclosure arrangement of claim 1, further comprising a management unit that mounts within the interior region of the enclosure.

11. The telecommunications enclosure arrangement of claim 1, wherein the first member is in a snap-fit engagement with the cover of the enclosure.

12. A telecommunications enclosure arrangement, comprising:
(a) an enclosure having a plurality of sidewalls, a base, and a cover connected to the base, the base and the cover cooperating to define an interior region, the cover being adapted for movement between an open position and a closed position;
(b) a plurality of spaced latches disposed on the plurality of sidewalls of the enclosure for securing the base and the cover together in the closed position; and
(c) a hinge that is a separate piece from the cover and the base, the hinge being adapted to be mounted on at least one of the plurality of sidewalls of the enclosure between the plurality of spaced latches, the hinge including
a unitary body with a first end including an anchoring plate with clamping flanges positioned on opposite sides thereof, the clamping flanges configured to slidably engage slots defined on a first one of the base or the cover and a second end including a pivot pin configured to engage a second one of the base or the cover, the pivot pin being configured to accommodate translation of the cover with respect to the base, the hinge being adapted to pivot the cover about an axis of rotation between the open and closed positions and including a pivoting arm that extends downwardly in a direction parallel to the anchoring plate, the pivoting arm having a distal end including the pivot pin adapted to slidably engage a channel defined in the second one of the base or the cover.

13. The telecommunications enclosure arrangement of claim 12, wherein the anchoring plate defines two openings separated by a dividing member, the two openings having respective flexible members therein.

14. The telecommunications enclosure arrangement of claim 13, wherein each one of the flexible members has a proximal end that is fixed at a bottom side of the anchoring plate, the flexible members also having a distal free end that is adapted to releasably engage corresponding tabs positioned on the cover.

15. A floating hinge, comprising:
(a) an anchoring plate with clamping flanges positioned on opposite sides thereof;
(b) an engagement member extending from a top portion of the anchoring plate, the engagement member having extension members that together define a slot, the extension members each having hook members; and
(c) a pivoting arm extending from a bottom portion of the anchoring plate, the pivoting arm having a pivot pin positioned at a distal end thereof.

16. The floating hinge of claim 15, wherein the anchoring plate defines two openings separated by a dividing member, the two openings having respective flexible members therein.

17. The floating hinge of claim 16, wherein each one of the flexible members has a proximal end that is fixed on the anchoring plate and a distal free end.

18. The floating hinge of claim 15, wherein the extension members extend perpendicular relative to the clamping flanges of the anchoring plate and the hook members extend parallel relative to the clamping flanges of the anchoring plate.

19. A telecommunications enclosure arrangement, comprising:
a housing including first and second housing pieces that cooperate to define an enclosure, the first and second housing pieces being movable between open and closed positions, the first and second housing pieces each having first and second side portions that cooperate to define first and second sides of the enclosure when the first and second housing pieces are in the closed position;

the first and second side portions of the second housing piece each having a hinge mounting interface integrated therewith; and a hinge structure that is a separate piece from the first and second housing pieces, the hinge structure having a connection interface intermateable with the hinge mounting interfaces at the first and second side portions of the second housing piece, wherein the hinge structure can be mounted at the first side portion of the second housing piece to provide a hinged connection with the first side portion of the first housing piece, or can be mounted at the second side portion of the second housing piece to provide a hinged connection with the second side portion of the first housing piece.

20. The telecommunications enclosure of claim 19, wherein the hinge structure includes a hinge pin, and wherein hinge pin receptacles configured for receiving the hinge pin are integrated with the first and second side portions of the first housing piece.

21. The telecommunications enclosure of claim 20, wherein the second housing piece is a cover and the first housing piece is a base.

22. The telecommunications enclosure of claim 19, wherein the first and second sides of the enclosure are positioned opposite from one another.

23. The telecommunications enclosure of claim 22, wherein the enclosure defines a third side that extends between the first and second sides, wherein the first and second housing pieces include third side portions that define the third side of the enclosure when the first and second housing pieces are in the closed position, and wherein the third side portion of the second housing piece includes another hinge mounting interface integrated therewith that is intermateable with the connection interface of the hinge structure.

24. The telecommunications enclosure of claim 23, wherein the enclosure defines a fourth side that extends between the first and second sides, the third and fourth sides being opposite from one another, the fourth side defining at least one sealed cable pass-through port location.

25. The telecommunications enclosure of claim 24, wherein the hinge structure includes a hinge pin, and wherein hinge pin receptacles configured for receiving the hinge pin are integrated with the first, second and third side portions of the first housing piece.

26. The telecommunications enclosure of claim 25, wherein the second housing piece is a cover and the first housing piece is a base.

27. The telecommunications enclosure of claim 19, wherein the connection interface of the hinge structure intermates with the hinge mounting interfaces via a snap-fit connection.

* * * * *